United States Patent
Kim et al.

(10) Patent No.: US 9,330,974 B2
(45) Date of Patent: May 3, 2016

(54) THROUGH LEVEL VIAS AND METHODS OF FORMATION THEREOF

(75) Inventors: Sunoo Kim, Hopewell Junction, NY (US); Muhammed Shafi Pallachalil, Wappingers Falls, NY (US); Moosung Chae, Poughkeepsie, NY (US); Erdem Kaltalioglu, Newburgh, NY (US)

(73) Assignee: Infineon Technologies AG, Neubiberg (DE)

( * ) Notice: Subject to any disclaimer, the term of this patent is extended or adjusted under 35 U.S.C. 154(b) by 1214 days.

(21) Appl. No.: 12/913,497

(22) Filed: Oct. 27, 2010

(65) Prior Publication Data
US 2012/0104622 A1    May 3, 2012

(51) Int. Cl.
*H01L 21/768*    (2006.01)
*H01L 23/522*    (2006.01)
*H01L 23/532*    (2006.01)

(52) U.S. Cl.
CPC ...... *H01L 21/76898* (2013.01); *H01L 21/7681* (2013.01); *H01L 21/76804* (2013.01); *H01L 21/76808* (2013.01); *H01L 23/5226* (2013.01); *H01L 23/5329* (2013.01); *H01L 23/53295* (2013.01); *H01L 23/53223* (2013.01); *H01L 23/53238* (2013.01); *H01L 2924/0002* (2013.01); *H01L 2924/00013* (2013.01)

(58) Field of Classification Search
CPC .................................................. H01L 21/76898
USPC .................................................... 438/622, 637
See application file for complete search history.

(56) References Cited

U.S. PATENT DOCUMENTS

| | | | | |
|---|---|---|---|---|
| 2002/0128388 | A1* | 9/2002 | Kennedy et al. | 525/100 |
| 2002/0173096 | A1* | 11/2002 | Okudaira | 438/253 |
| 2005/0176243 | A1* | 8/2005 | Han et al. | 438/640 |
| 2005/0221622 | A1* | 10/2005 | Shioya et al. | 438/758 |
| 2007/0128874 | A1* | 6/2007 | Shida et al. | 438/692 |
| 2009/0075465 | A1* | 3/2009 | Fan | 438/586 |
| 2009/0166868 | A1* | 7/2009 | Lee et al. | 257/751 |
| 2009/0239375 | A1 | 9/2009 | Riess et al. | |
| 2011/0003471 | A1* | 1/2011 | King et al. | 438/633 |

* cited by examiner

*Primary Examiner* — Ha Tran T Nguyen
*Assistant Examiner* — Aaron Dehne
(74) *Attorney, Agent, or Firm* — Slater & Matsil, L.L.P.

(57) ABSTRACT

In one embodiment, a semiconductor device includes a first metal line disposed in a first metal level above a substrate. A second metal line is disposed in a second metal level disposed over the first metal level. A third metal line is disposed in a third metal level disposed over the second metal level. A through level via contacts the first metal line and the third metal line.

26 Claims, 29 Drawing Sheets

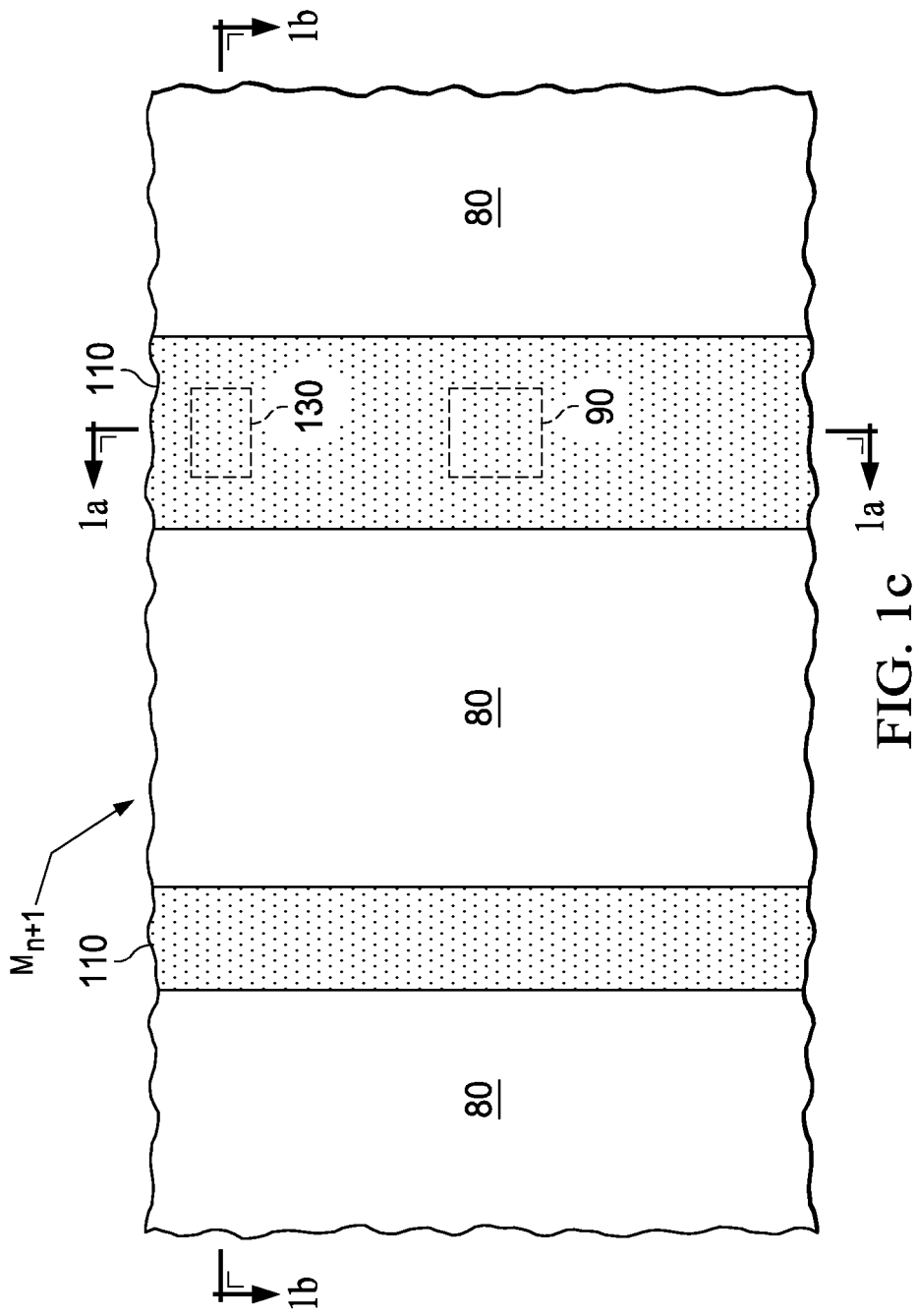

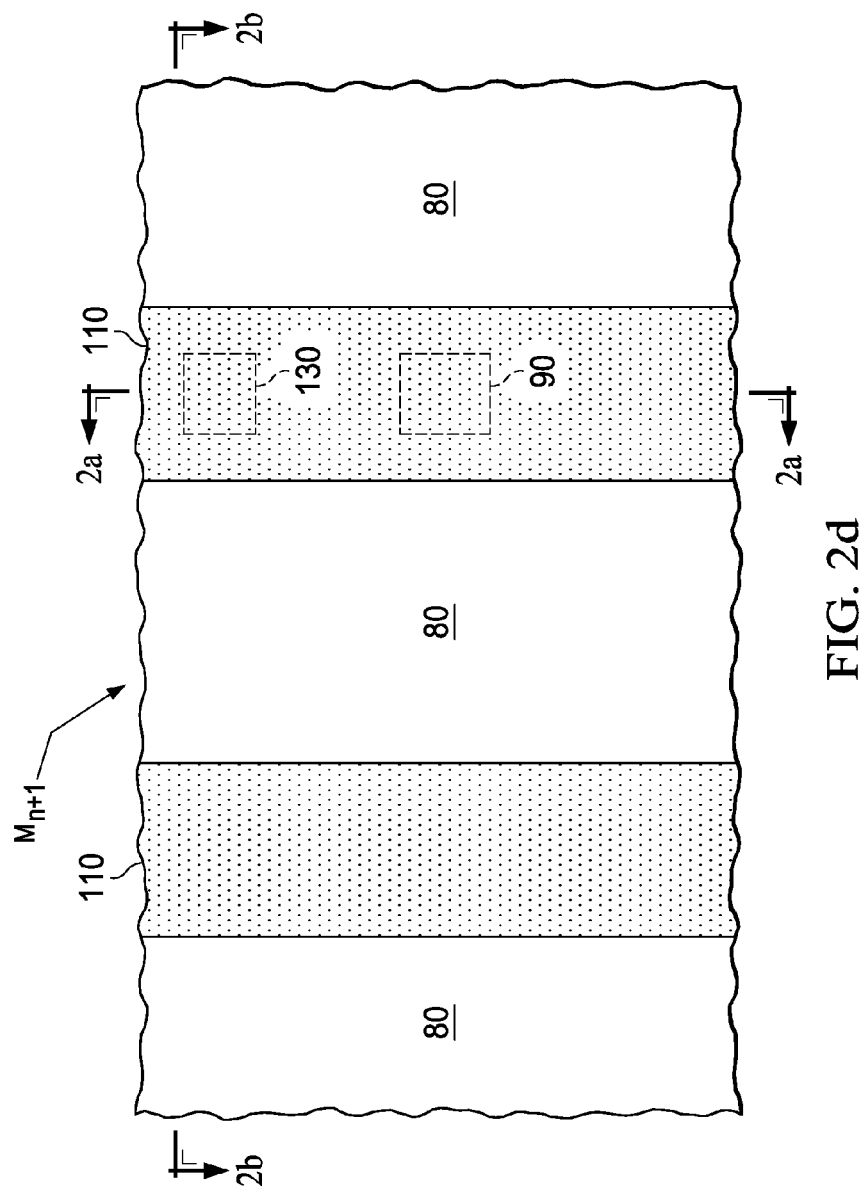

THROUGH LEVEL VIAS AND METHODS OF FORMATION THEREOF

TECHNICAL FIELD

The present invention relates generally to vias, and more particularly to through level vias and methods of formation of through level vias.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). The conductive lines in immediately neighboring horizontal metallization layers may be connected vertically in predetermined places by vias formed between the conductive lines.

One of the challenges in semiconductor technology requires developing technologies that minimize process variations. Hence, a given technology is optimized in view of the process limitations. For example, metal lines are normally patterned wider near and above vias to minimize misalignment errors. However, such adjustments in the process are usually at some other expense. For example, wider metal lines result in a reduction in spacing between the metal lines, and can result in unwanted effects such as yield or performance loss.

Thus, what are needed in the art are cost effective ways of forming BEOL metallization without significant increase in costs or yield, performance and reliability loss.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a first metal line disposed in a first metal level above a substrate. A second metal line is disposed in a second metal level disposed over the first metal level. A third metal line is disposed in a third metal level disposed over the second metal level. A through level via contacts the first metal line and the third metal line.

In accordance with another embodiment of the present invention, a method of forming a semiconductor device comprises forming a first metal level above a substrate. The first metal level comprises a first metal line. A second metal level is formed over the first metal level. The second metal level comprises a second metal line. The method further comprises forming a third metal level over the second metal level. The third metal level comprises a third metal line. A through level via is formed contacting the first metal line and the third metal line.

In accordance with yet another embodiment of the present invention, method of forming a semiconductor device comprises forming a first inter-level dielectric layer comprising a first metal line over a substrate. A second inter-level dielectric layer comprising a second metal line is formed over the first inter-level dielectric layer. A third inter-level dielectric layer is formed over the second inter-level dielectric layer. A through via opening is formed in the second and the third inter-level dielectric layers. The through via opening is filled with a conductive material.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1c, illustrates a semiconductor device in accordance with an embodiment of the invention, wherein FIGS. 1a and 1b illustrate cross sectional views, and wherein FIG. 1c illustrates a planar view;

FIG. 2, which includes FIGS. 2a-2e, illustrates further structural embodiments of the invention;

FIG. 3, which includes

FIG. 4, which includes

FIG. 5, which includes FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A requirement in connecting metal lines in different metal levels with vias is the need to overlay the metal line trench with the via opening. This may involve minimizing any wafer, as well as, mask alignment errors. Hence, in practice, this misalignment between the metal line trenches and via openings is minimized by etching the metal lines wider than the vias, particularly on top of the vias.

However, wider metal lines over the vias result in other problems. For example, the increased metal width reduces the spacing between neighboring or adjacent metal lines. Particularly, if this spacing decreases to a distance less than the design rule spacing, significant deleterious impacts may be observed. For example, the reduced spacing between metal lines may decrease the process margin during manufacturing and result in lower process yield. The increased metal width can also reduce performance (increased interconnect coupling) as well as increased reliability problems during product testing (e.g., dielectric breakdown such as TDDB) and operation.

Alternatively, to overcome these problems, metal lines in higher metal levels are spaced to a larger distance. For example, in one case, metal lines in a first metal level and metal lines in a second metal level may be separated by a minimum distance of 1×, while metal lines in a third metal level may be separated by a minimum distance of 2×. However, such a design rule comes at the cost of a larger chip area to make all the needed interconnects. For example, if the metal lines in a third metal level are separated by a minimum distance of 2× and metal lines in a first metal level are separated by a minimum distance of 1×, connecting the third metal level to the first metal level requires at least two vias and increases structural complexity and decreases areal design efficiency.

Embodiments of the invention overcome these and other problems by forming vias between non-consecutive metal levels.

A structural embodiment of the invention will be first described using FIG. 1. Further structural embodiments will be described with respect to FIGS. 2 and 6. Embodiments of the methods of fabrication will be described using FIGS. 3-5.

Figure 1A:
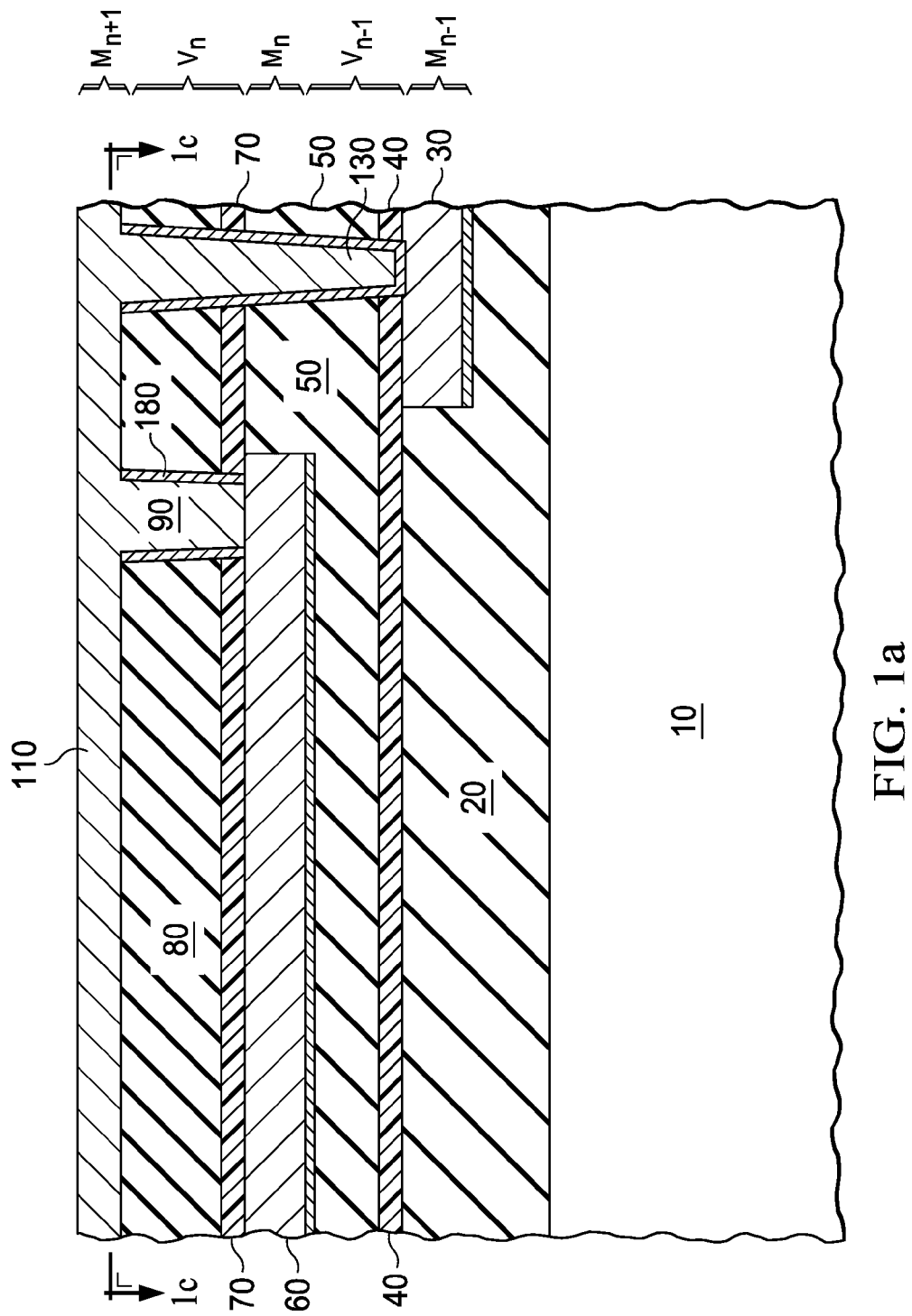
Figure 1B:
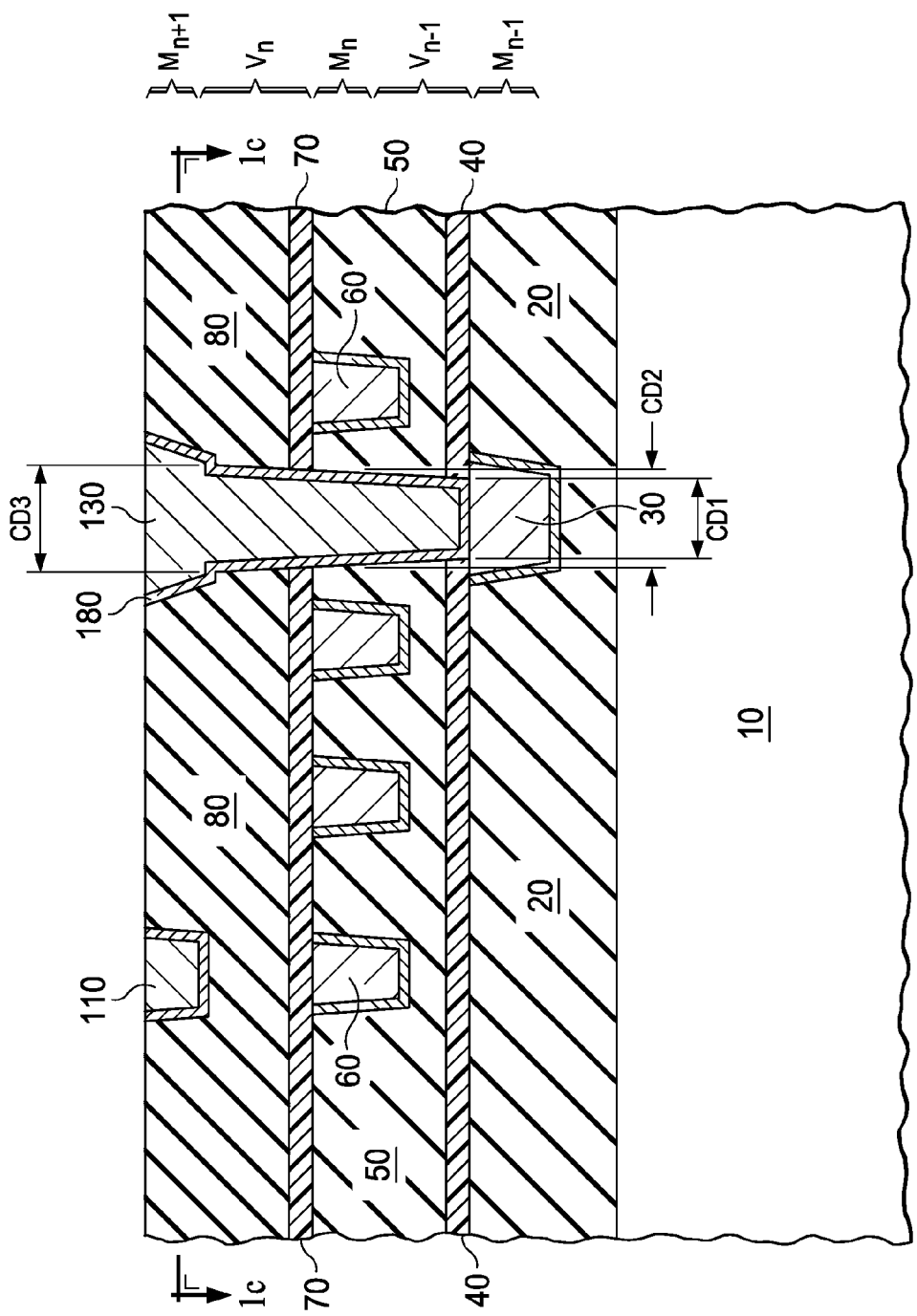

FIG. 1, which includes FIGS. 1a-1c, illustrates a semiconductor device in accordance with an embodiment of the invention. FIGS. 1a and 1b illustrate cross sectional views, whereas FIG. 1c illustrates a planar view.

Referring to FIGS. 1a and 1b, the device 1 comprises a substrate 10 comprising the active devices (not shown) forming the active circuitry of the semiconductor chip. The active circuitry may comprise the active device regions and include transistors, resistors, capacitors, inductors or other components used to form integrated circuits. For example, active areas that include transistors (e.g., CMOS transistors) can be separated from one another by isolation regions (e.g., shallow trench isolation), which are not illustrated.

The device 1 further comprises metallization layers disposed over the active device regions. The metallization layers electrically contact and interconnect the active devices. The metallization layers and the active device regions together form a complete functional integrated circuit. In other words, the electrical functions of the chip can be performed by the interconnected active circuitry. Logic devices may include many metallization layers, e.g., nine or more, of copper or alternatively of other metals. Memory devices, such as DRAMs, may have less number of metal levels and may be aluminum. The interconnect structure is typically covered with additional passivation layer and other suitable contact structures.

FIGS. 1a and 1b illustrate the metallization layers with metal levels such as $M_{n-1}$, $M_n$, $M_{n+1}$, and corresponding via levels $V_{n-1}$ to $V_n$. The metal levels connect the various active devices on the chip and form lateral wiring over the active devices, whereas, the via levels vertically connect the different metal levels.

Each metal level comprises metal lines embedded in an inter-level dielectric layer. For example, the metal level $M_{n-1}$ comprises first metal lines 30 embedded in a first inter-level dielectric layer 20. The first metal lines 30 comprise a metal such as aluminum or copper. Further metal lines may be disposed underneath the first inter-level dielectric layer 20 in a lower metal level, such as $M_{n-2}$.

A second inter-level dielectric layer 50 is disposed over the first inter-level dielectric layer 20. A third inter-level dielectric layer 80 is disposed over the second inter-level dielectric layer 50. The first, the second, and the third inter-level dielectric layers 20, 50, and 80 may comprise the same dielectric material in one embodiment.

In various embodiments, the first, the second, and the third inter-level dielectric layers 20, 50, and 80 may comprise silicon dioxide, or low-k dielectric materials such as a fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) and methylsilsesquioxane (MSQ), porous silicate glass, xerogel, aerogel, nano clustered silica (NCS), porous organo silicate glass, porous organics.

The first and the second inter-level dielectric layers 20 and 50 may be separated by a first etch stop layer 40. Similarly, the second and the third inter-level dielectric layers 50 and 80 are separated by a second etch stop layer 70. The first and the second etch stop layers 40 and 70 comprise a material comprising SiCHN although, in other embodiments, other nitrides or other suitable materials may be used. Examples of etch stop layer material include silicon nitride (SiN), silicon oxynitride (SiON), silicon carbide (SiC) or silicon carbo nitride (SiCN).

Each of the first and the second inter-level dielectric layers 20 and 50 may be a single layer or may comprise a plurality of sub-layers separated by physical boundaries (interfaces).

The second inter-level dielectric layer 50 comprises second metal lines 60. The third inter-level dielectric layer 80 comprises third metal lines 110. The metal lines between consecutive metal levels are connected by vias, such as first via 90. First vias 90, therefore, connect metal levels with no intermediate metal levels between the connecting metal levels.

In accordance with an embodiment of the invention, the device 1 further comprises a through level via 130. The through level via 130 passes through at least one metal level, such as $M_n$, while directly connecting two metal levels such as $M_{n+1}$ and $M_{n-1}$. The through level via 130 may comprise an outer barrier layer 180 and an inner core filled with a metal. The outer barrier layer 180 may comprise a diffusion barrier and/or an adhesion layer, and may include titanium, tantalum, ruthenium, tungsten.

The through level via 130 comprises a bottom CD CD1 at the top surface of the metal level $M_{n-1}$, a mid CD CD2 at the metal level $M_n$, and a top CD CD3 at the bottom surface of the metal level $M_{+1}$. In various embodiments, the mid CD CD2 is geometrically related to the top and the bottom CDs CD1 and CD3. For example, in one or more embodiments, the through level via 130 may be shaped like a cylinder or trapezoid (cone like).

As illustrated in FIGS. 1a and 1b, a top surface of the through level via 130 physically contacts a bottom surface of a metal line of the third metal lines 110. In one or more embodiments, the top surface of the through level via 130 and the bottom surface of the third metal lines 110 are copper because the third metal lines 110 and the through level via 130 are formed in a single fill process such as an electro-deposition process.

FIG. 1c is a planar view of the semiconductor device and illustrates a plurality of metal lines (third metal lines 110) embedded in a dielectric material (third inter-level dielectric layer 80). FIG. 1c also illustrates the through level via 130 and the first via 90 disposed under the third metal lines 110.

FIG. 2, which includes FIGS. 2a-2e, illustrates further structural embodiments of the invention.

Figure 2A:
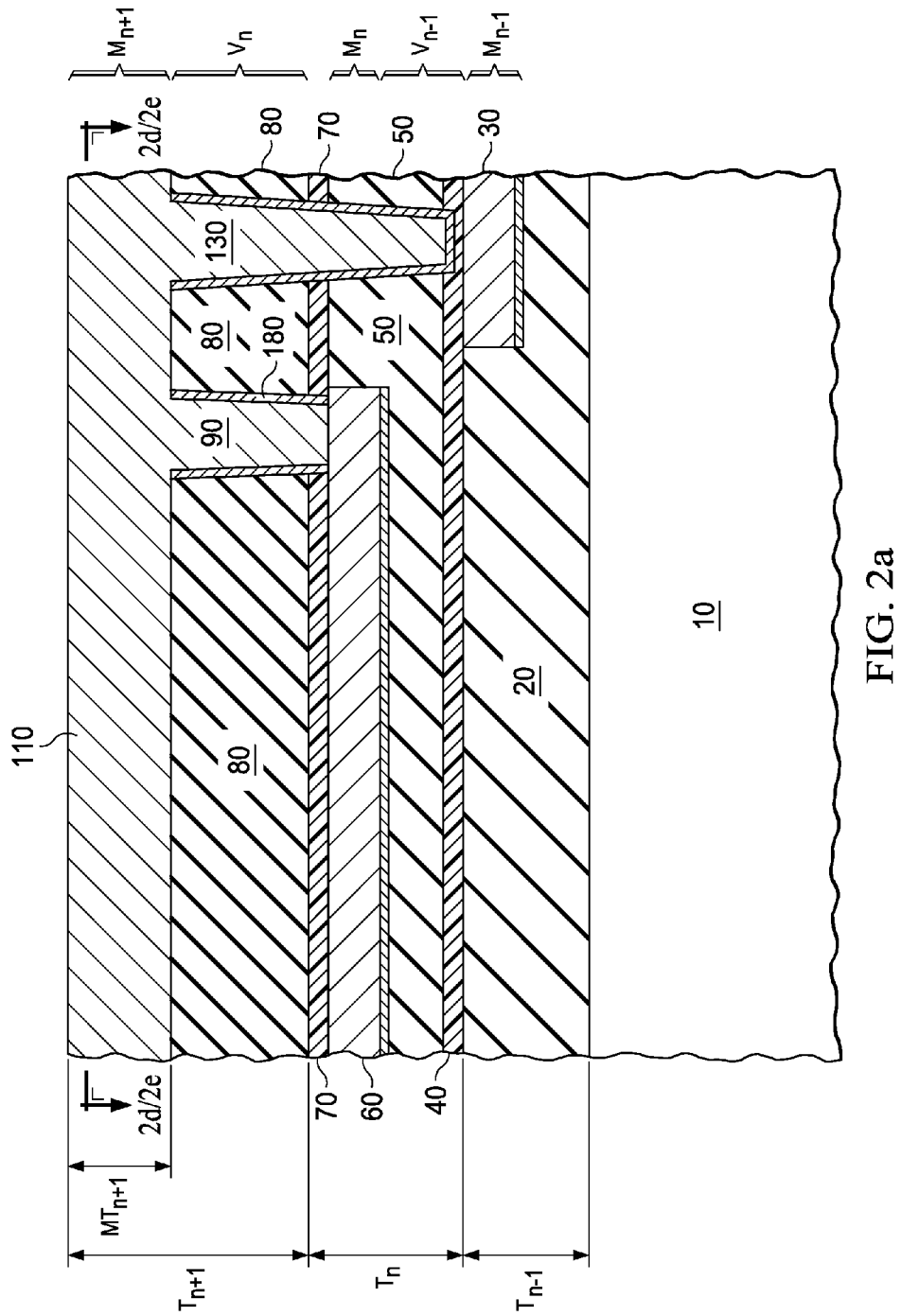

FIG. 2a illustrates a cross sectional view similar to FIG. 1a. However, as illustrated in FIG. 2a, the first thickness $T_{n-1}$ of the first inter-level dielectric layer 20, the second thickness $T_n$ of the second inter-level dielectric layer 50 is about the same but smaller than the third thickness $T_{n+1}$ of the third inter-level dielectric layer 80. In various embodiments, the dimensions of the metal level $M_{n+1}$ are larger than the underlying metal level by a scaling factor guided by design rules. Consequently, the metal line thickness $MT_{n+1}$ of the metal lines of the metal level $M_{n+1}$ may be thicker in this embodiment. Similarly, the vias in the via level $V_n$ may be deeper.

Figure 2B:
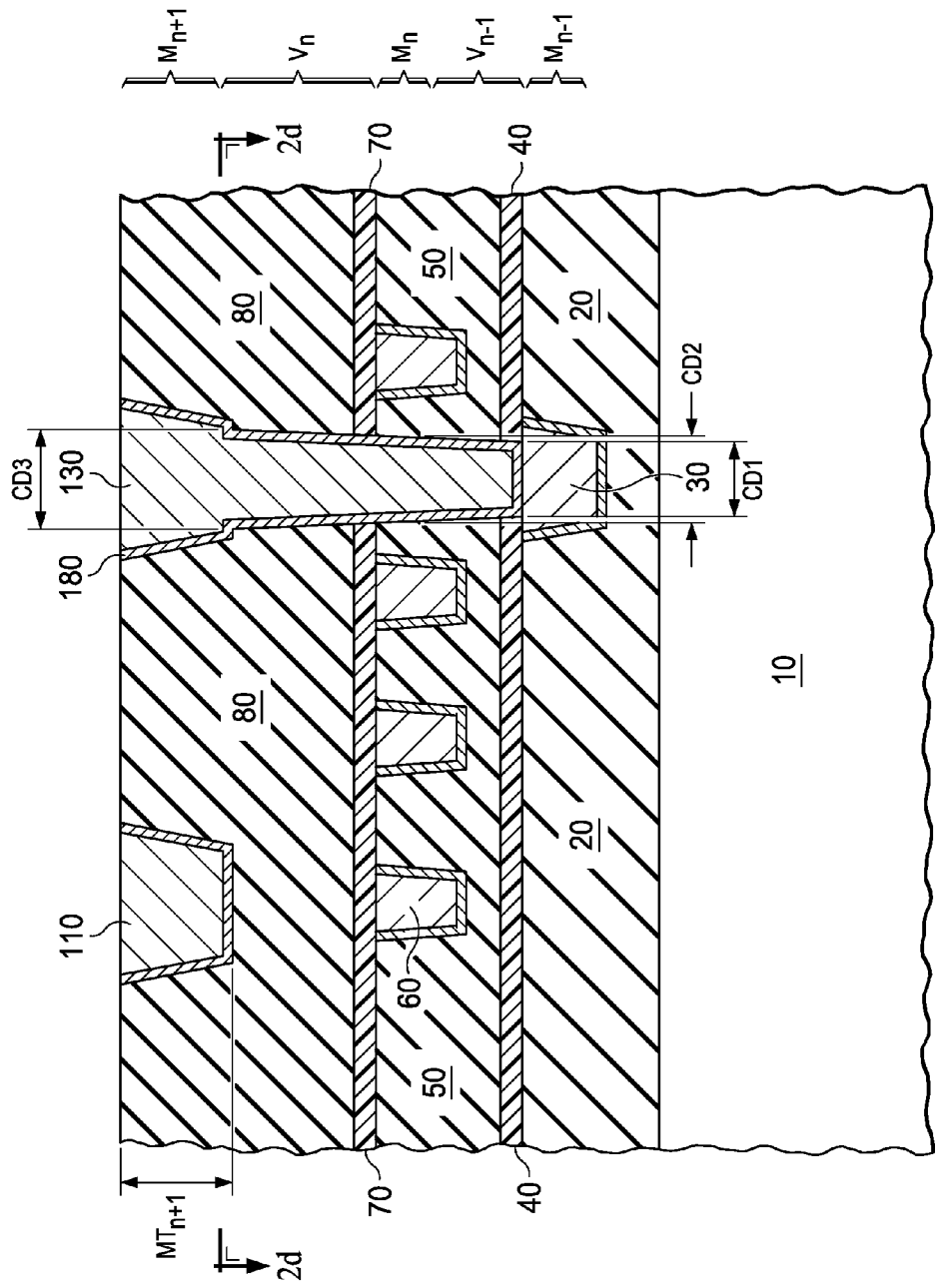
Figure 2C:
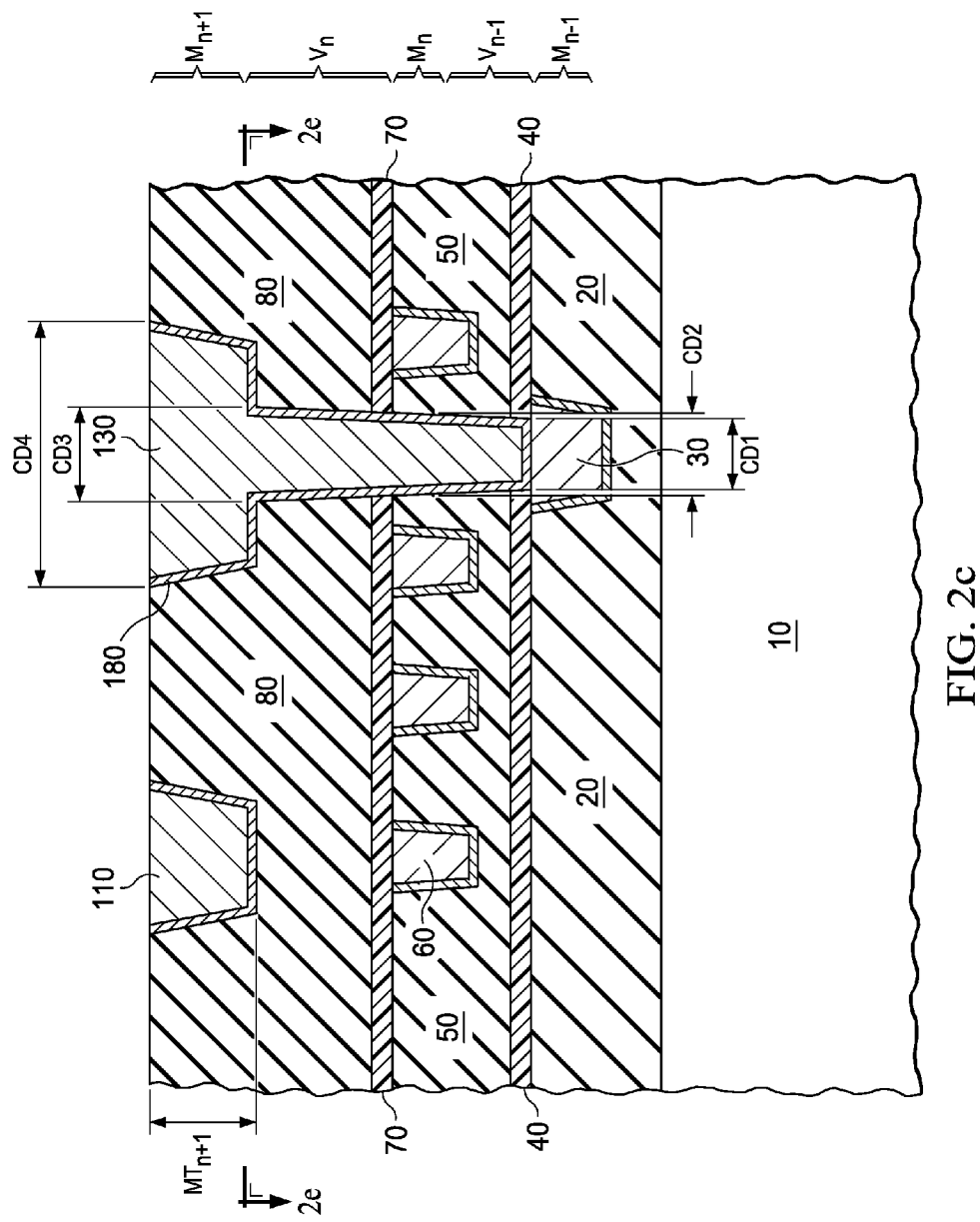
Figure 2E:
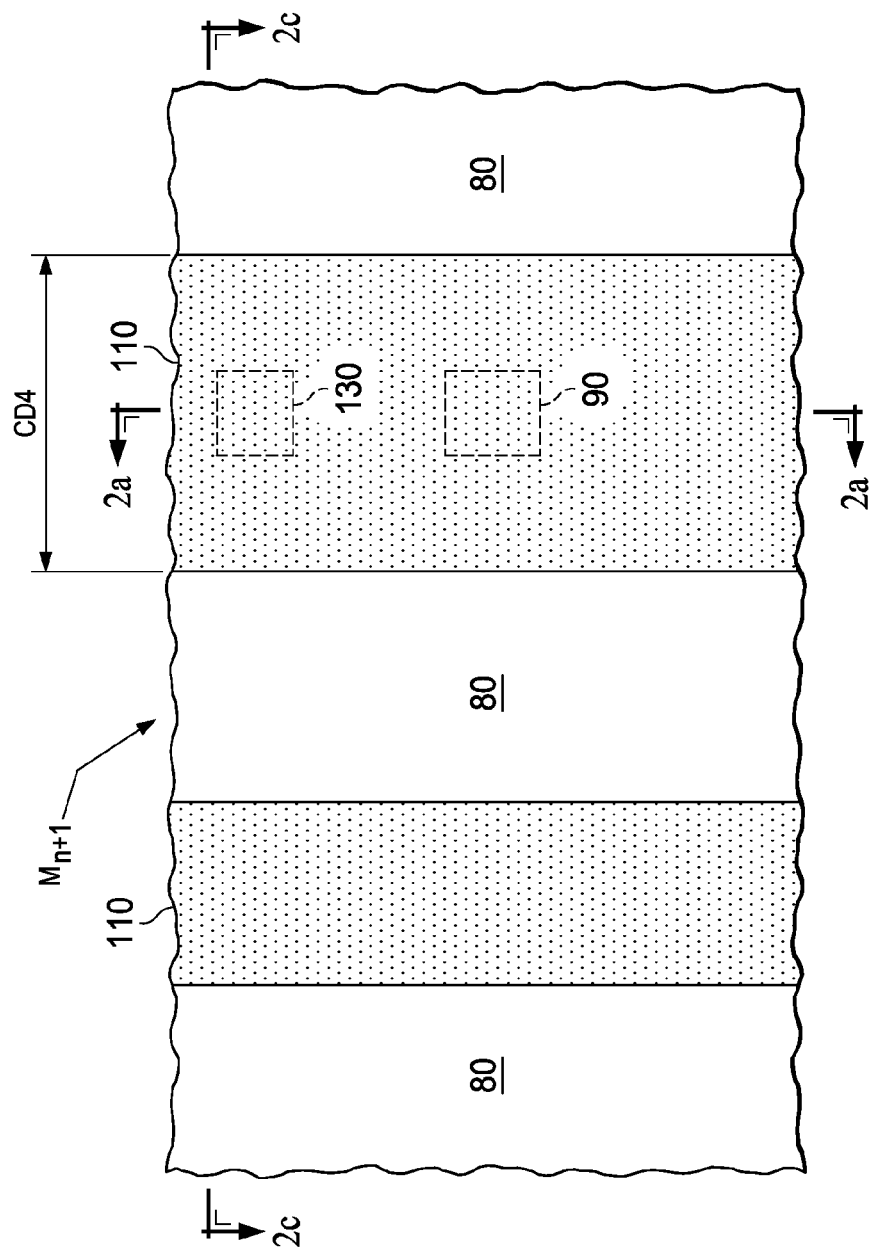

FIGS. 2b and 2c illustrate perpendicular cross sectional views in alternate embodiments. In the first embodiment of FIG. 2b, the metal lines have about the same critical dimension as the top CD CD3 of the through level via 130. In contrast, in a different embodiment illustrated in FIG. 3c, the metal line can be wider and have a fourth CD CD4 wider than the top CD CD3 of the through level via 130. The top views of these embodiments are illustrated in FIG. 2d, which corresponds to FIG. 2b, and FIG. 2e, which corresponds to FIG. 2c.

FIG. 3, which includes FIGS. 3a-3f, illustrates a method of fabrication of a through level via in accordance with an embodiment of the invention.

Figure 3A:
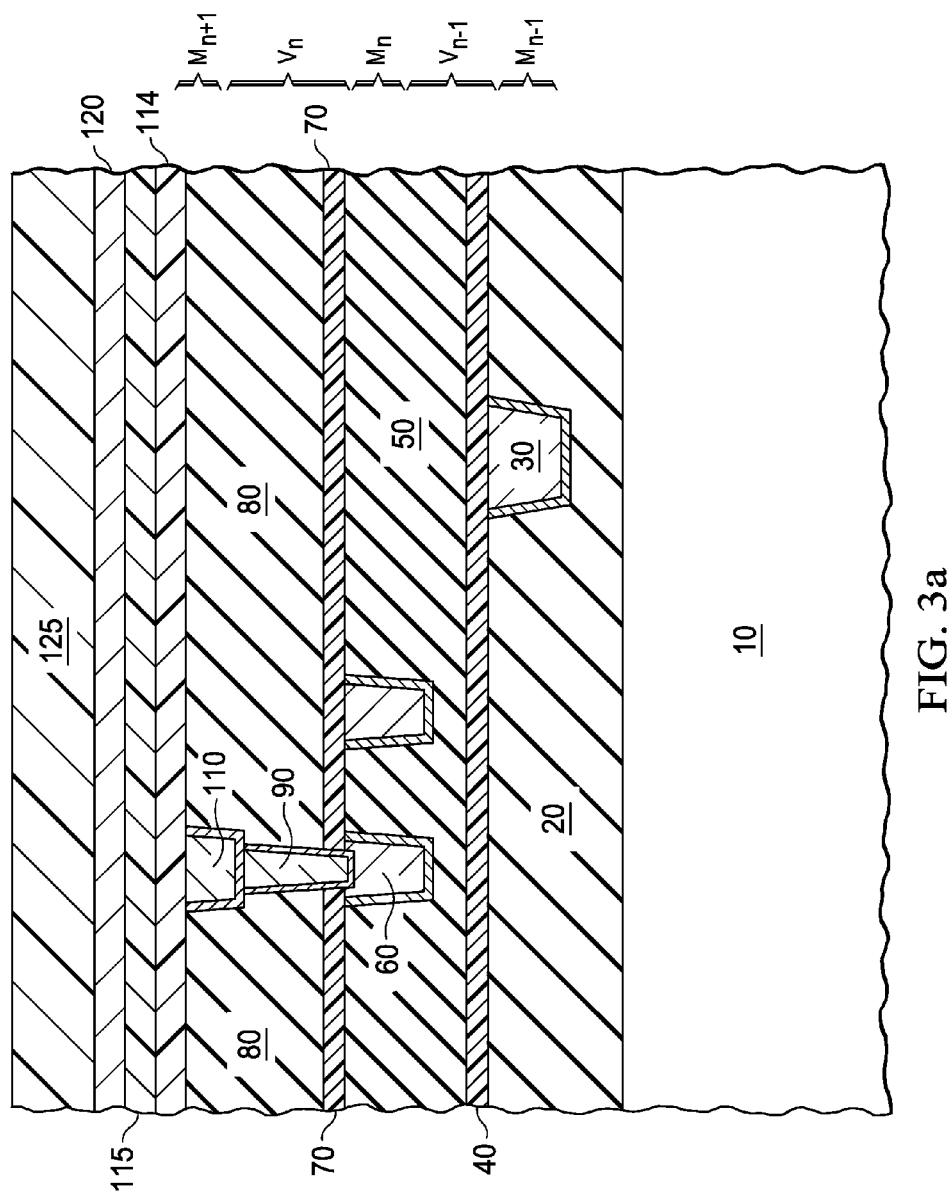
FIGS. 3a-3f, illustrates a method of fabrication of a through level via in accordance with an embodiment of the invention.

Referring first to FIG. 3a, a substrate 10 having device regions (not shown) is formed. After forming the device regions during FEOL processing, the BEOL processing may start with the deposition of an inter-level dielectric such as a first inter-level dielectric layer 20.

The first inter-level dielectric layer 20 is deposited using a vapor deposition process such as chemical vapor deposition process in one embodiment. In alternative embodiments, the first inter-level dielectric layer 20 is deposited using a spin-on process in one embodiment. In one embodiment, the first inter-level dielectric layer 20 comprises silicon oxide such as tetra ethyl oxysilane (TEOS).

After forming contact plugs (not shown) contacting the device regions, first metal lines 30 are formed in the first inter-level dielectric layer 20. The first metal lines 30 comprise a metal such as aluminum or copper. If copper is used as the first metal lines 30, an electrochemical deposition process may be used. Alternatively, if aluminum is used, the first metal lines 30 may be deposited and patterned.

A first etch stop layer 40 is deposited over the first inter-level dielectric layer 20. The first etch stop layer 40 comprises SiCHN although, in other embodiments, other nitrides or other suitable materials may be used. Examples of materials used for first etch stop layer 40 include silicon nitride (SiN), silicon oxynitride (SiON), silicon carbide (SiC) or silicon carbo nitride (SiCN).

After depositing a first etch stop layer 40, a second inter-level dielectric layer 50 is deposited over the first etch stop layer 40 and the first inter-level dielectric layer 20. The second inter-level dielectric layer 50 may comprise silicon dioxide, or low-k dielectric materials such as a fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) and methylsilsesquioxane (MSQ), porous silicate glass, xerogel, aerogel, nano clustered silica (NCS), porous organo silicate glass, porous organics. In various embodiments, the second inter-level dielectric layer 50 may be deposited using a vapor deposition process or a spin-on process.

If a dual damascene process is used, patterns for vias and metal lines are formed together and the openings are vias and metal lines are filled using the same process. If a single damascene process is used, vias and metal lines are patterned and filled separately. In various embodiments, processing may include either dual damascene or a single damascene process.

Vias (not shown) and second metal lines 60 are formed within the second inter-level dielectric layer 50. A second etch stop layer 70 may be formed on the second inter-level dielectric layer 50.

A third inter-level dielectric layer 80 is formed over the second inter-level dielectric layer 50. The third inter-level dielectric layer 80 may be deposited using vapor deposition or a spin-on process. The third inter-level dielectric layer 80 may comprise silicon dioxide, or low-k dielectric materials such as a fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) and methylsilsesquioxane (MSQ), porous silicate glass, xerogel, aerogel, nano clustered silica (NCS), porous organo silicate glass, porous organics.

Vias (such as first vias 90) and third metal lines 110 are formed within the third inter-level dielectric layer 80.

A protective layer 114 is deposited over the third inter-level dielectric layer 80. The protective layer 114 is used to protect the underlying third inter-level dielectric layer 80 during via etch processes. In various embodiments, the protective layer 114 comprises an etch resistant material such as silicon carbide, nitrogen doped silicon carbide, SiCN such as NBLOK™.

A first hard mask layer 115 is deposited over the protective layer 114. The first hard mask layer 115 comprises $SiO_2$ such as tetra ethyl oxysilane (TEOS), silicon carbide (SiC) or carbon doped glass, but in various embodiments other materials may be used. In various embodiments, the first hard mask layer 115 comprises a plurality of sub-layers. In one embodiment, the sub-layers comprise different material layers.

A first patternable layer 120 is deposited over the first hard mask layer 115. A first photo resist 125 is deposited over the first patternable layer 120. The first patternable layer 120 may comprise various sub-layers. The first patternable layer 120 may include an anti reflective coating (ARC), a planarization layer, and top coating layer, and other suitable layers. A inter level via mask is used to expose the first photo resist 125. However, as will be described with respect to an alternative embodiment, the inter level via mask may be combined with the via mask used for forming the vias such as first via 90 in the via level $V_n$. The first photo resist 125 is next developed, for example, by a low temperature bake.

Figure 3B:
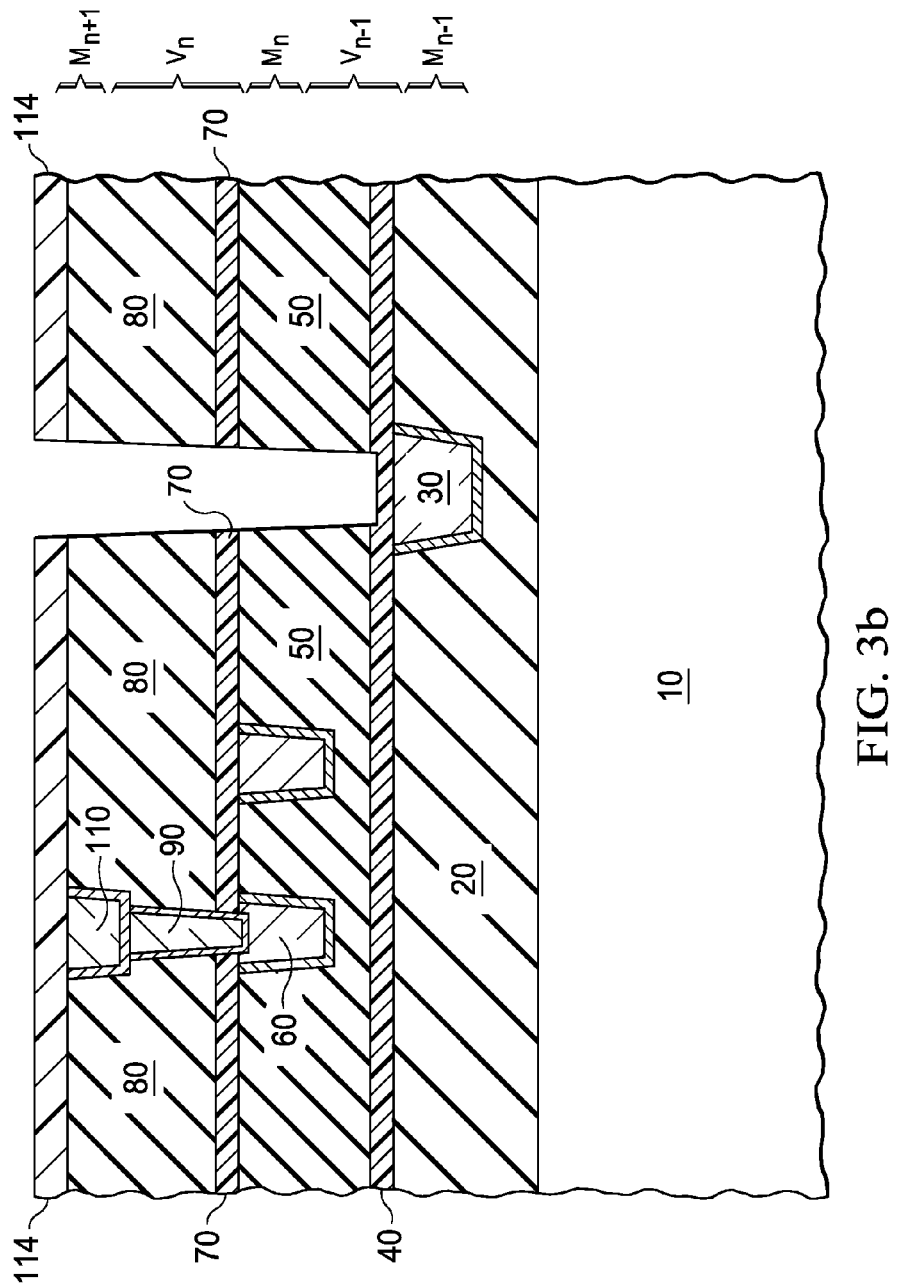

Referring to FIG. 3b, a through via opening 140 is formed. The developed first photo resist 125 is etched to expose the first patternable layer 120. An anisotropic RIE process etches the first patternable layer 120, the first hard mask layer 115, the third inter-level dielectric layer 80, the second etch stop layer 70, the second inter-level dielectric layer 50, and stops on the first etch stop layer 40. Care must be taken not to etch through the first etch stop layer 40 to avoid corroding the first metal lines 30. The etch chemistry selectively etches the insulating layers relative to the metal.

Any remaining first photo resist 125 and the first patternable layer 120 are stripped off to form the through via opening 140 as illustrated in FIG. 3b. The through via opening 140 forms the opening for forming an inter level via. Some or all of the first photo resist 125 may be etched during the formation of the through via opening 140.

Figure 3C:
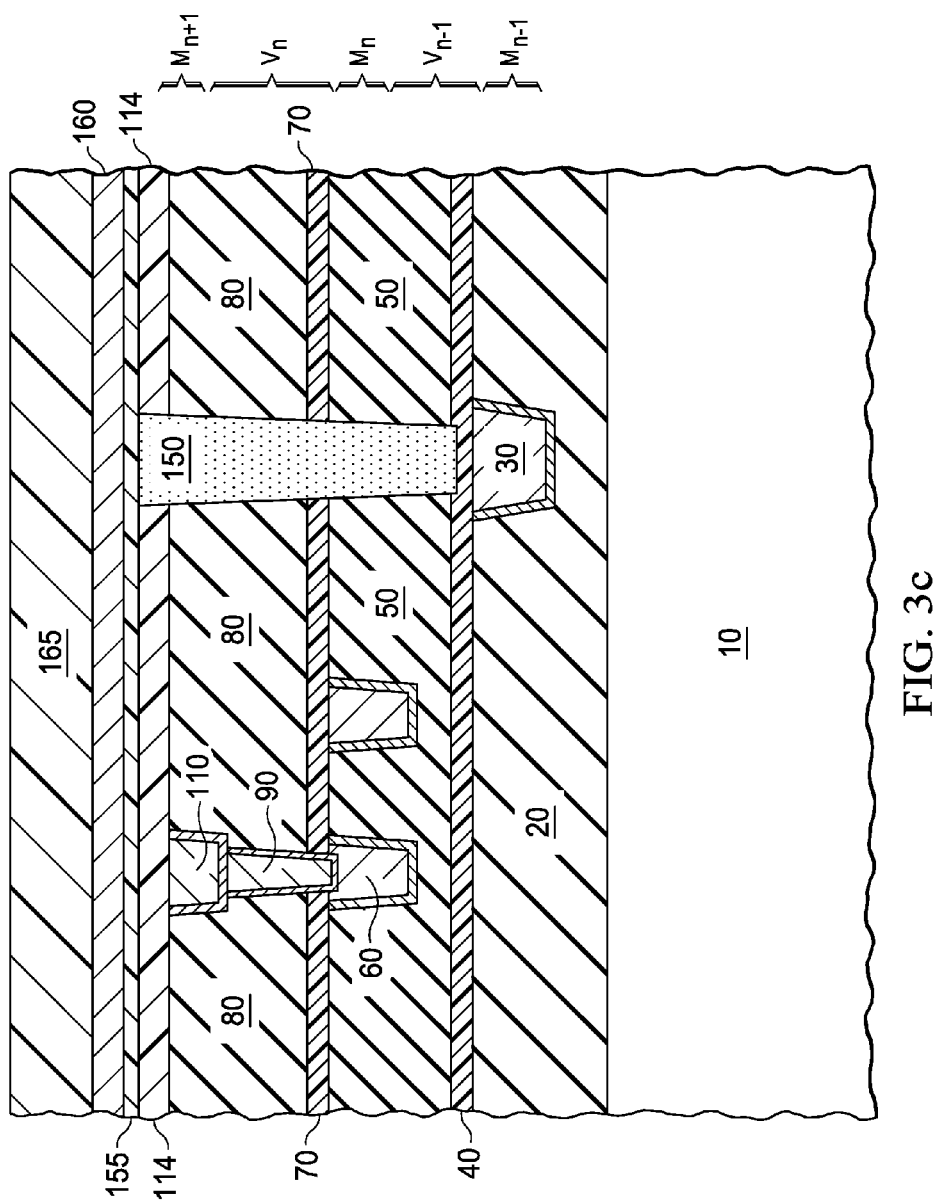

As illustrated in FIG. 3c, a dummy fill material 150 is next used to fill the through via opening 140 and forms dummy filled vias. The dummy fill material 150 comprises a self-planarizing spin on material such as acrylic-based photoresist, a novolak-based photoresist, a polyhydroxystyrene-based photoresist, or other bottom anti-reflective coating materials (BARC).

The dummy fill material 150 is overfilled to form a smooth surface. A second hard mask layer 155 is deposited over the dummy fill material 150, followed by a deposition of a second patternable layer 160. The second patternable layer 160 may be a stacked layer comprising anti reflective coating (ARC) layer. The second hard mask layer 155 comprises a low temperature oxide layer in one embodiment. A second photo resist 165 is deposited over the second patternable layer 160.

Figure 3D:
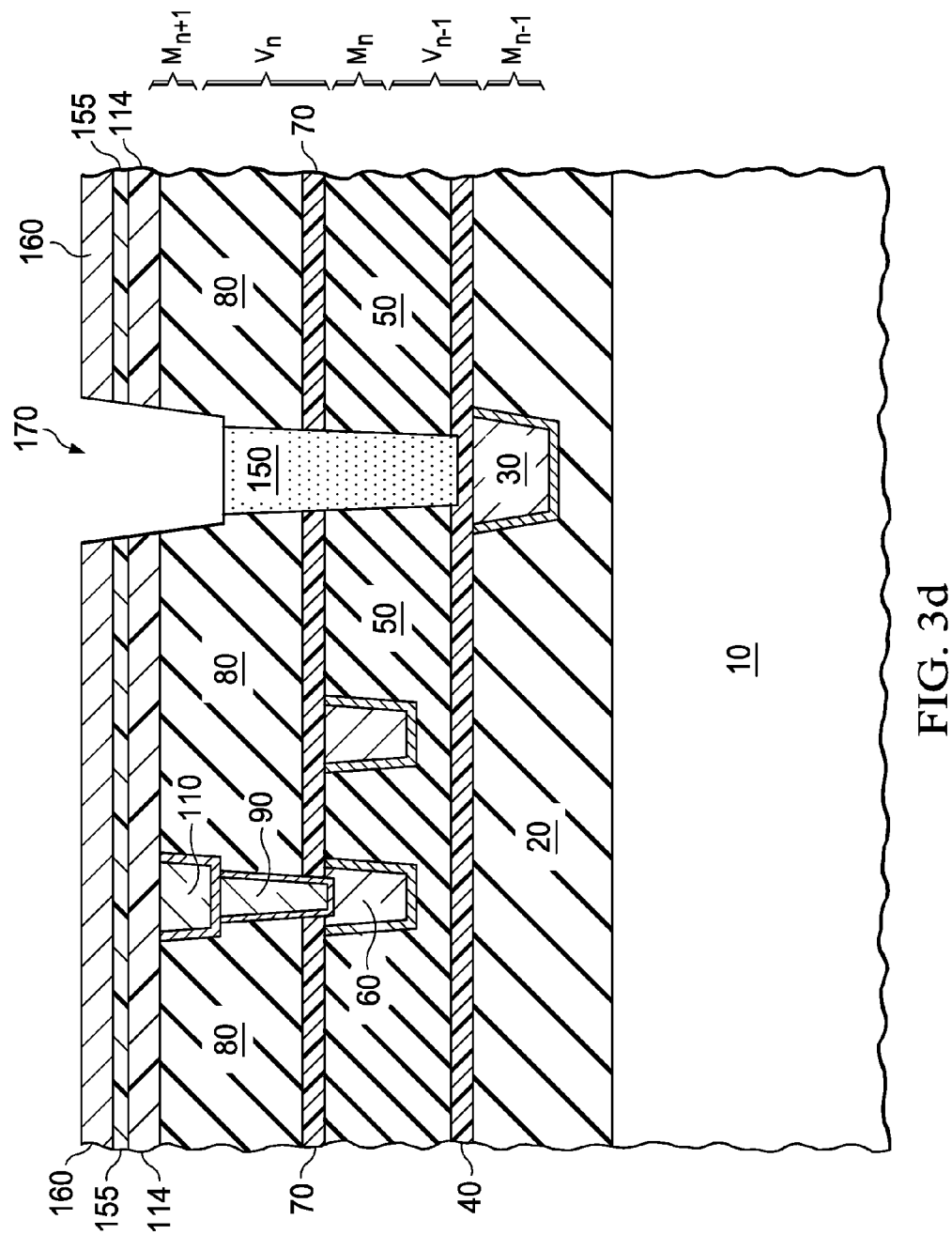

Referring next to FIG. 3d, a metal line mask is used to pattern the second photo resist 165. The metal line mask is wider than the underlying dummy filled vias, to minimize misalignment.

An anisotropic etch is used to etch through the second patternable layer 160, the second hard mask layer 155 and the dummy fill material 150. Alternatively, the dummy fill material 150 may be removed using a wet etch process. In one embodiment, the anisotropic etch comprises a reactive ion etch (RIE). In various embodiments, the second patternable layer 160 and the second hard mask layer 155 are etched using $CF_4/CHF_3$ chemistry for the RIE process.

Figure 3E:
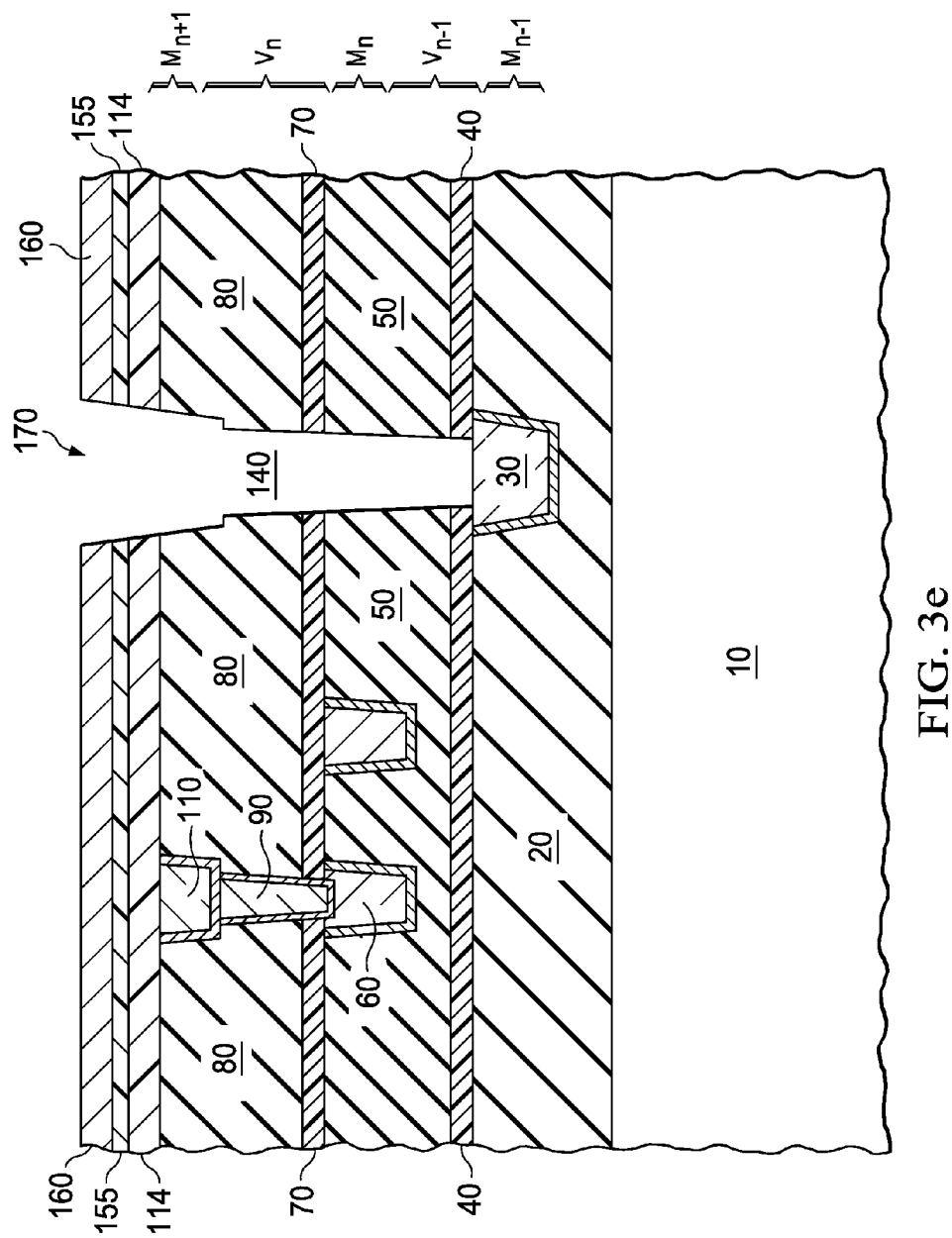

As next illustrated in FIG. 3e, the etch proceeds by removing the dummy fill material 150 from the dummy filled openings. The RIE progresses using a $CO/N_2$, $Ar/O_2$ or $O_2/CO/N_2$ chemistry to etch the dummy fill material 150 and second inter-level dielectric layer 50. Different RIE chemistry may be selected to etch the dummy fill material 150 and the second inter-level dielectric layer 50 in some embodiments.

The RIE etch may stop at the first etch stop layer 40 in one embodiment. A wet etch may be used to remove the first etch stop layer 40 to expose the underlying first metal lines 30 and thereby forming metal line trenches 170 and the through via opening 140.

Figure 3F:
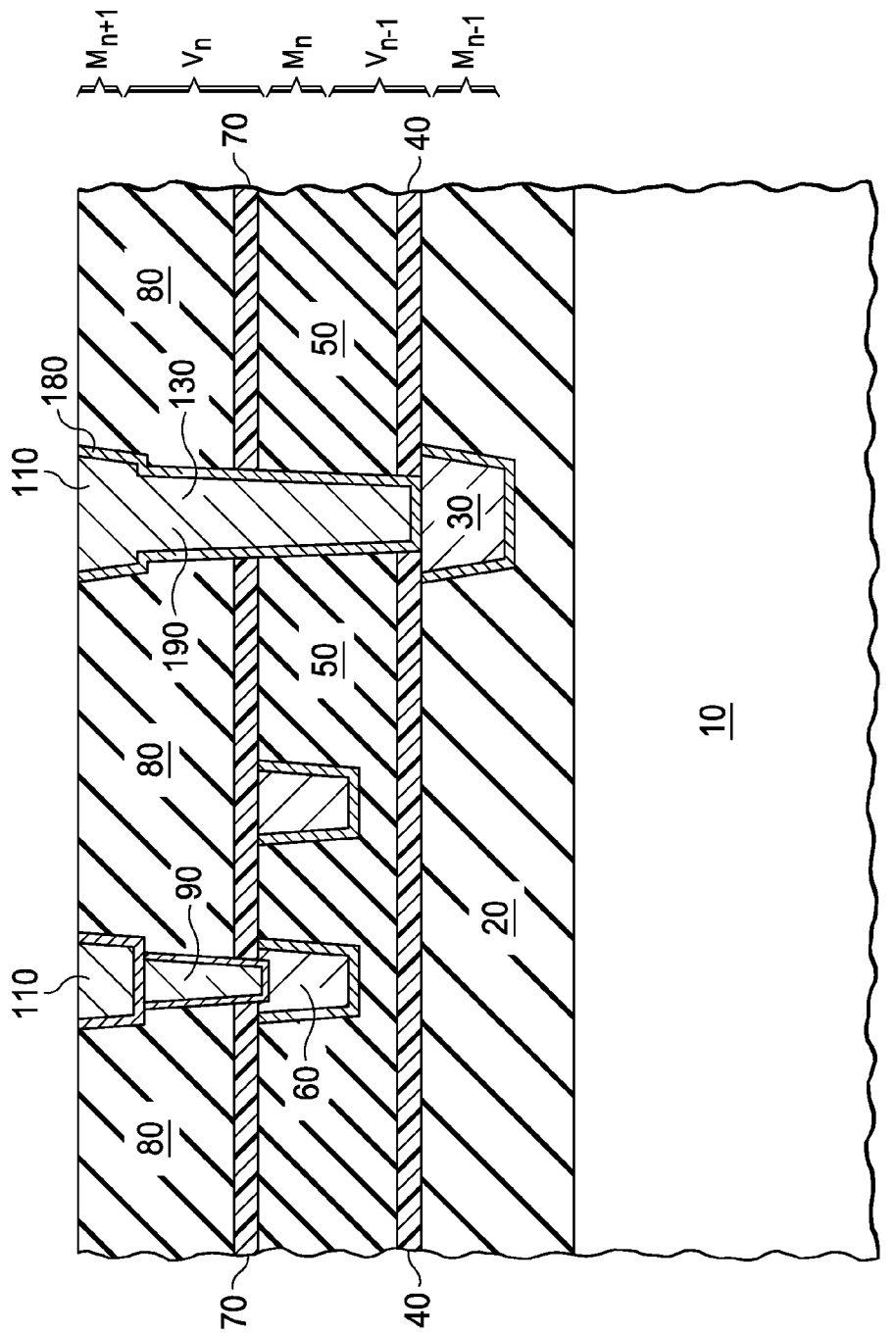

As illustrated in FIG. 3f, the metal line trenches 170 and the through via opening 140 are filled with a metal forming the through level via 130 and third metal lines 110.

Referring to FIG. 3f, a metal liner 180 is deposited into the metal line trenches 170 and the through via opening 140 by a suitable process such as PVD, sputtering, CVD. In various embodiments, the metal liner 180 comprises a diffusion barrier metal such as titanium nitride, titanium, tantalum, tantalum nitride, tungsten nitride, tungsten carbo nitride (WCN), ruthenium or other suitable conductive nitrides or oxides.

A fill metal 190 is deposited over the metal liner 180. The fill metal 190 may be deposited over a top surface of the remaining second patternable layer 160 and/or the second hard mask layer 155.

The fill metal 190 is deposited by an electro chemical deposition process in one or more embodiments. The fill metal 190 comprises copper or its alloys, although in some embodiments, the fill metal 190 may comprise aluminum, gold, tungsten, and combinations thereof or other suitable conductive materials. The fill metal 190 and metal liner 180 form the third metal lines 110, as well as the through level via 130 connecting the third metal lines 110 with the first metal lines 30.

The fill metal 190 is planarised and polished using a suitable process such as chemical mechanical polishing (CMP). The CMP process may also remove the remaining second patternable layer 160, the remaining second hard mask layer 155 and/or the protective layer 114. However, in various embodiments, the second hard mask layer 155 may not be removed completely and may be used as a liner to the next inter-level dielectric layer.

FIG. 4, which includes FIGS. 4a-4f, illustrates another embodiment of the fabrication process.

Figure 4A:
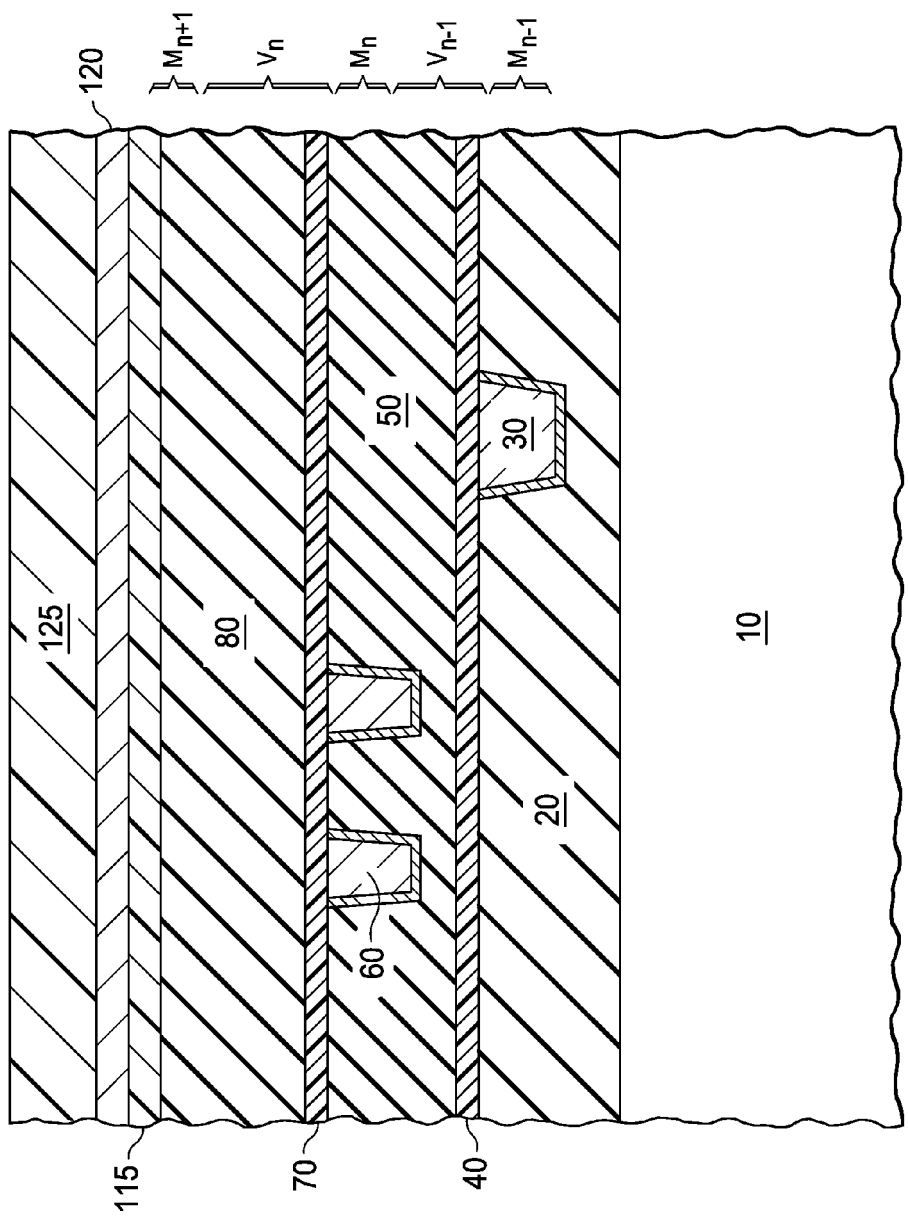
FIGS. 4a-4f, illustrates a method of fabrication of a through level via in accordance with an embodiment of the invention.

Referring to FIG. 4a, the first inter-level dielectric layer 20, the second inter-level dielectric layer 50, and the third inter-level dielectric layer 80 are formed as in the prior embodiment. The inter-level dielectric layers are separated by etch stop liners (first and second etch stop layers 40 and 70) as in previous embodiments. Similarly, first and second metal lines 30 and 60 are formed within the first and the second inter-level dielectric layers 20 and 50.

However, first vias and third metal lines are not formed at this stage of processing. Instead, a first hard mask layer 115, a first patternable layer 120, and a first photo resist 125 are formed over the third inter-level dielectric layer 80.

Figure 4B:
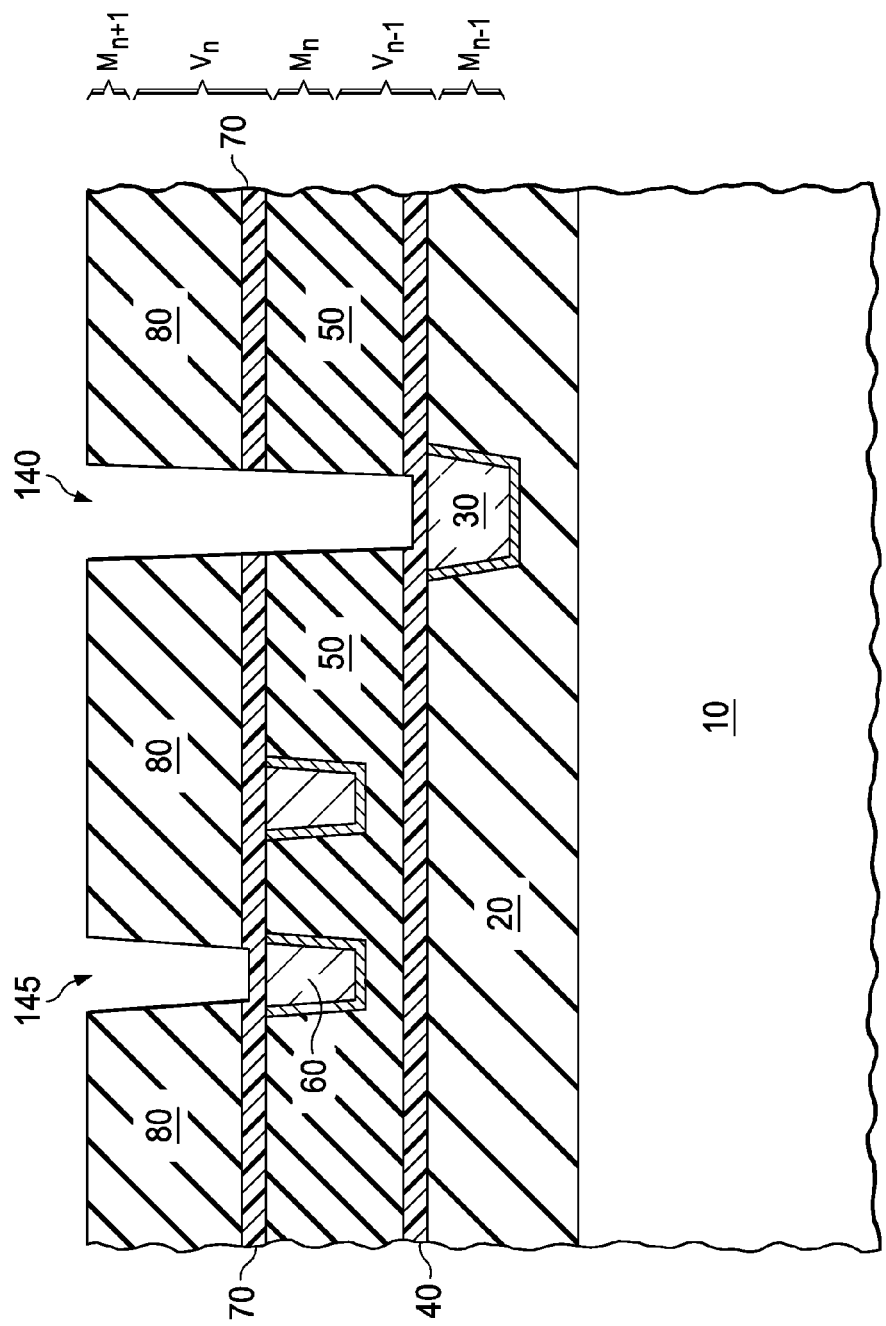

Referring next to FIG. 4b, openings for through vias and inter-level vias are formed. As illustrated, a via opening 145 and a through via opening 140 are formed within the third inter-level dielectric layer 80. As in prior embodiments, the through via opening 140 is formed extends into the second inter-level dielectric layer 50.

In various embodiments, the via opening 145 and the through via opening 140 are formed using an anisotropic etch process such as reactive ion etch (RIE) process. The RIE chemistry is chosen to be selective (not etch) metal lines. Therefore, the etching stops when the via opening 145 reaches the top surface of the second metal lines 60, whereas the etch progress through the second inter-level dielectric layer 50.

In one or more embodiments, the etch may also be selective to the first and/or the second etch stop layers 40 and 70. In such embodiments, the etch is stopped when the etch stop layer is reached. A wet etch may be used to remove the second etch stop layer 70. The RIE process may be continued, which extends the through via opening 140 up to the first metal lines 30 but not the via opening 145, which is stopped by the second metal lines 60. However, care must be taken to avoid misalignment between the second metal lines 60 and the via opening 145.

Figure 4C:
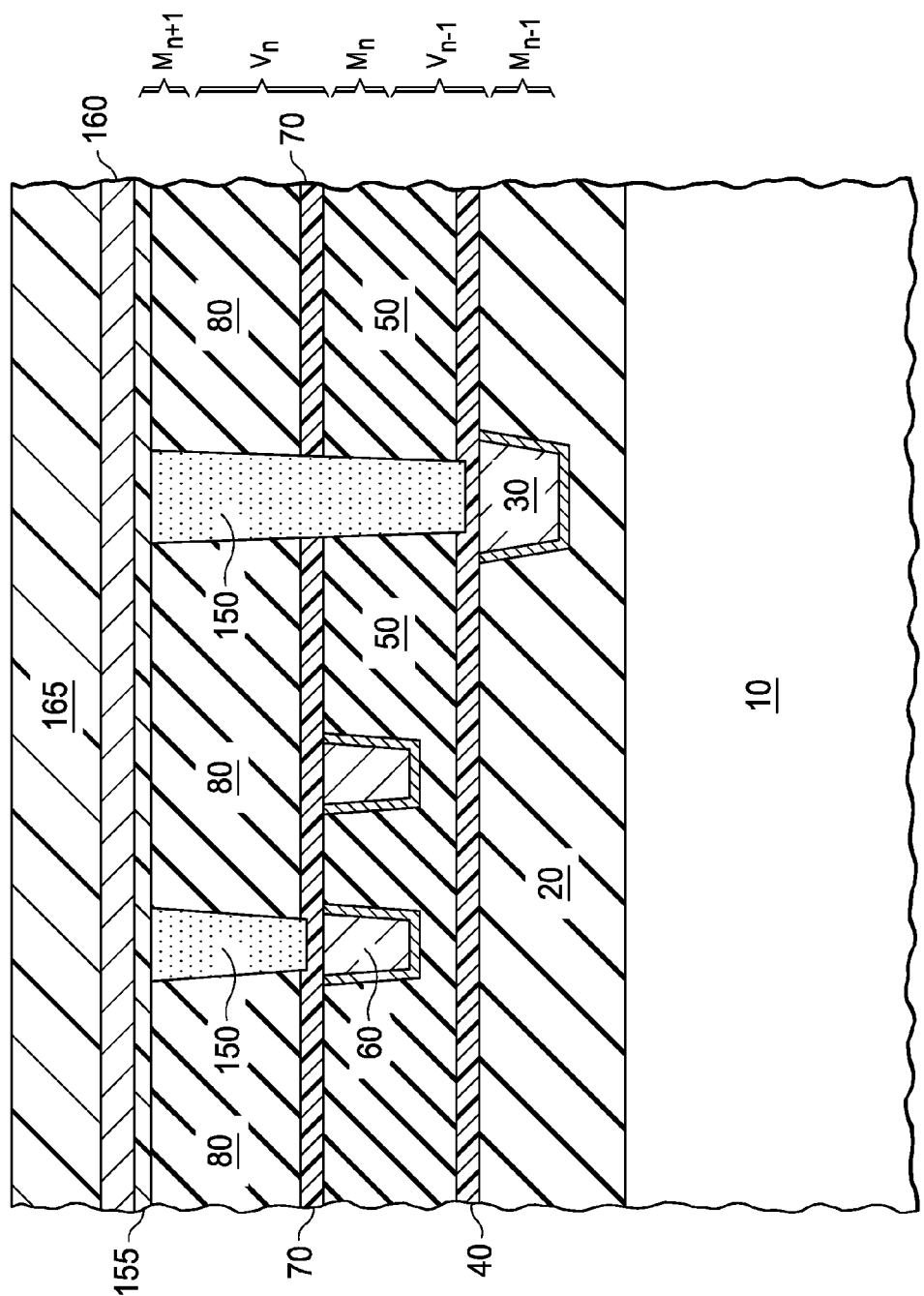

As next illustrated in FIG. 4c, a dummy fill material 150 is used to fill the through via opening 140 and the via opening 145 and form dummy filled vias. The dummy fill material 150 may comprise a self-planarizing spin on material and may be overfilled to form a smooth surface. A second hard mask layer 155 is deposited over the dummy fill material 150, followed by a deposition of a second patternable layer 160 and a second photo resist 165.

Figure 4D:
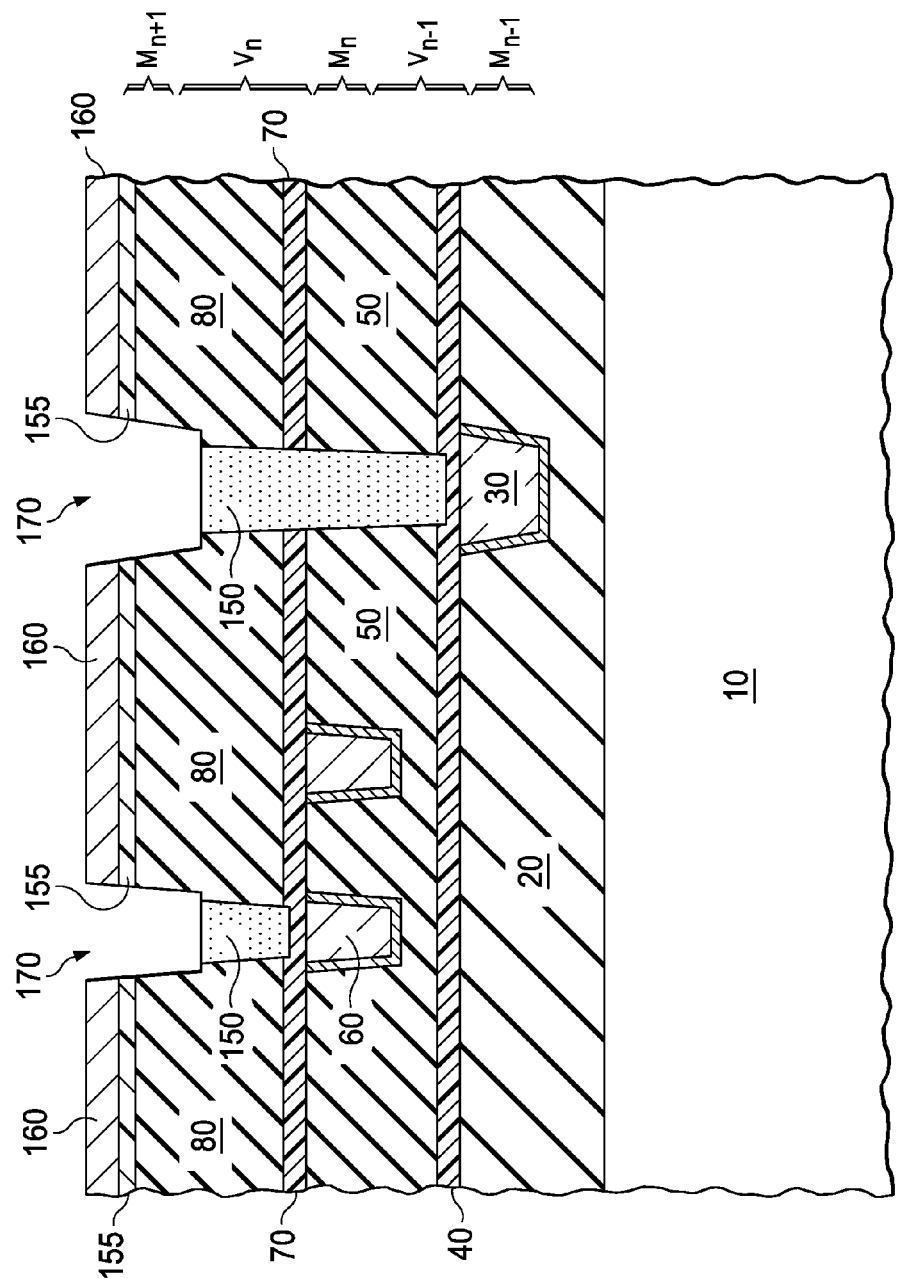

Referring next to FIG. 4d, a metal line mask is used to pattern the second photo resist 165. The metal line mask is wider than the underlying dummy filled vias, to minimize misalignment.

Metal line trenches 170 are next formed. An anisotropic etch, such as reactive ion etch (RIE), is used to etch through the second patternable layer 160, the second hard mask layer 155.

Figure 4E:
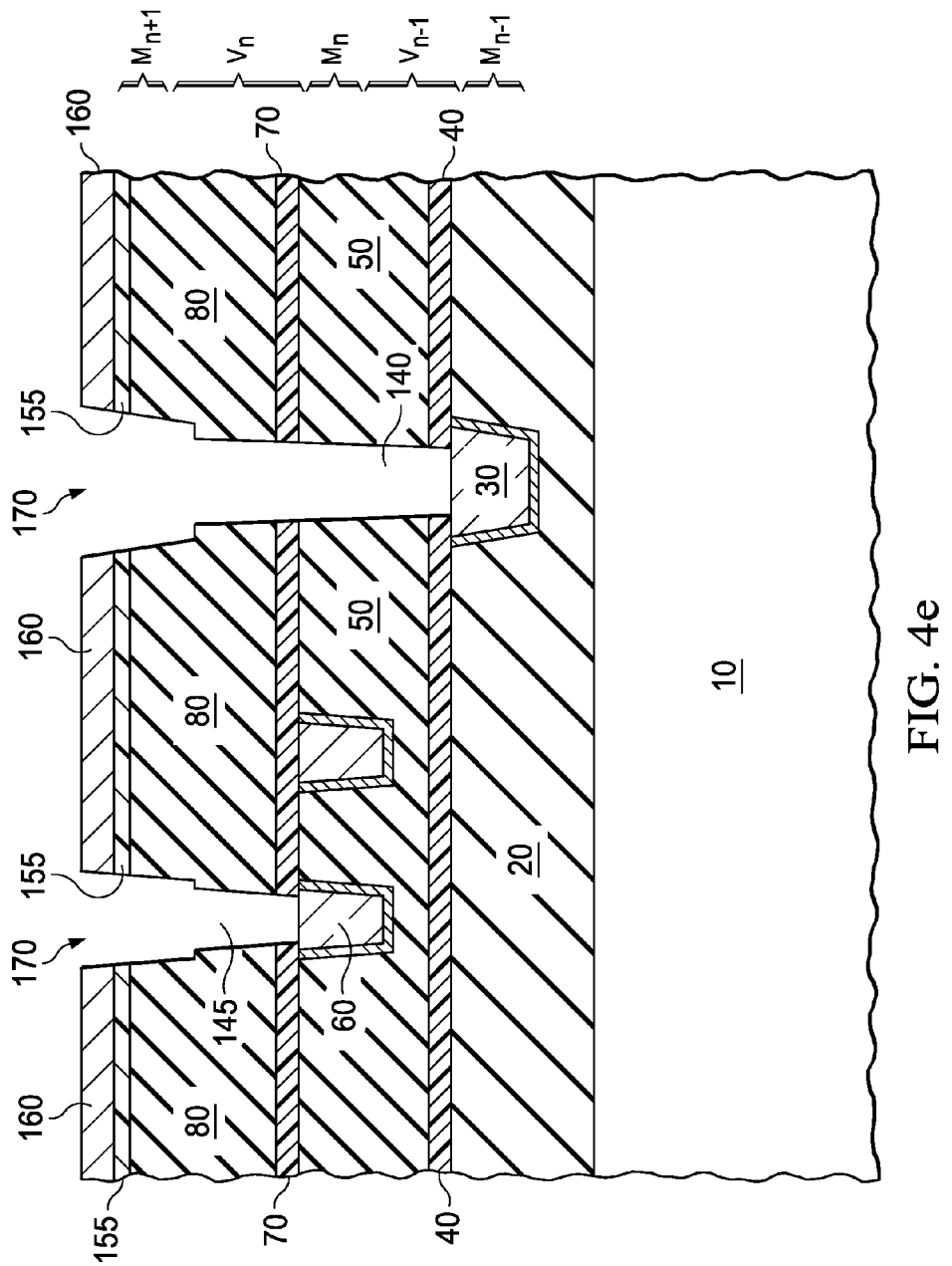

As illustrated in FIG. 4e, the dummy fill material 150 is removed forming metal lines trenches 170, a through via opening 140, and a via opening 145. Alternatively, the dummy fill material 150 may be removed using a wet etch process. In one or more embodiments, the RIE process proceeds by removing the dummy fill material 150 from the dummy filled openings.

Figure 4F:
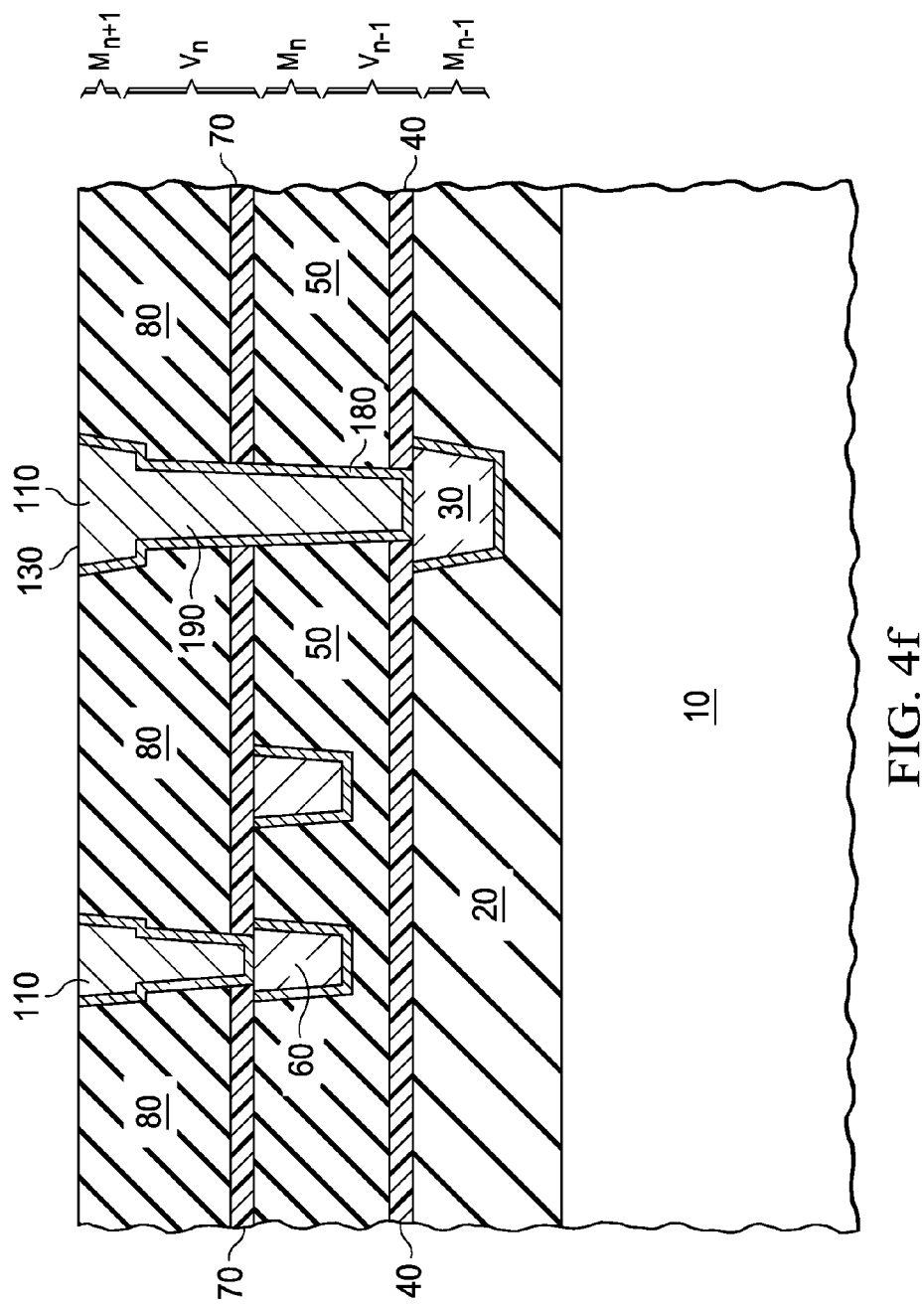

As illustrated in FIG. 4f, the metal line trenches 170, the via opening 145, through via opening 140 is filled with a metal forming the through level via 130 and third metal lines 110.

Referring to FIG. 4f, a metal liner 180 is deposited into the metal line trenches 170, via opening 145 and the through via opening 140 by a suitable process such as PVD, sputtering, CVD. A fill metal 190 is deposited over the metal liner 180 as described in prior embodiments, e.g., using an electro chemical deposition process. The fill metal 190 and metal liner 180 form the third metal lines 110, as well as the through level via 130 connecting the third metal lines 110 with the first metal lines 30. The fill metal also forms the first via 90 connecting the third metal lines 110 with the second metal lines 60. The fill metal 190 is planarised and polished as in prior embodiments.

FIG. 5, which includes FIGS. 5a-5f, illustrates another embodiment of the fabrication process.

In this embodiment, via openings are first formed followed by metal line trenches. However, unlike the embodiment of FIG. 4, a pattern for the metal line trenches is formed prior to forming the via openings. Both the via openings and the metal line trenches are filled simultaneously as in the prior embodiment.

Figure 5A:
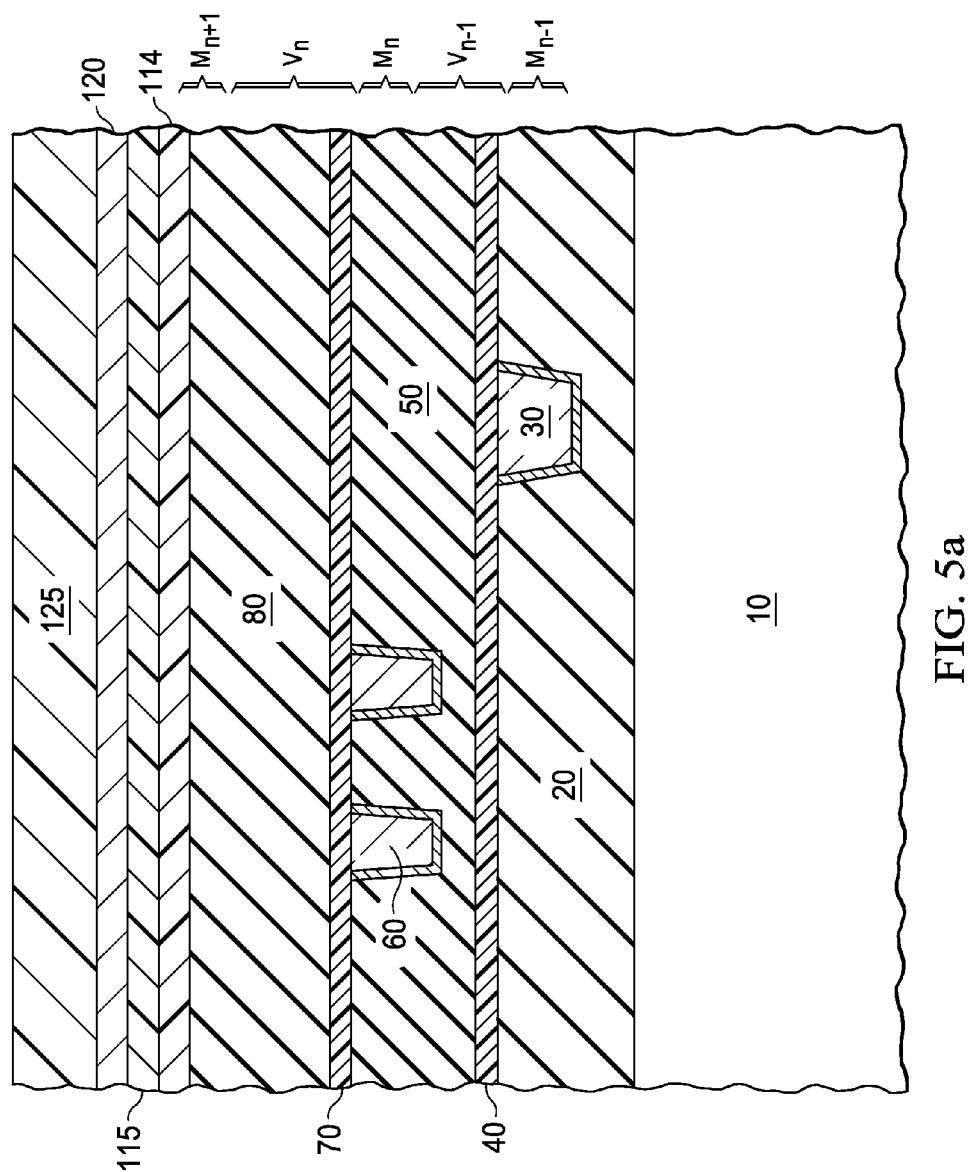
FIGS. 5a-5f, illustrates another embodiment of the fabrication process.

Referring to FIG. 5a, this embodiment starts out similar to the prior embodiment illustrated in FIG. 4a. However, an additional protective layer 114 may be deposited before depositing the first hard mask layer 115. The protective layer 114 may comprise a material resistant to etching during the reactive ion etching of vias. In various embodiments, the protective layer 114 comprises an etch resistant material such as silicon carbide, nitrogen doped silicon carbide, SiCN such as NBLOK™.

Figure 5B:
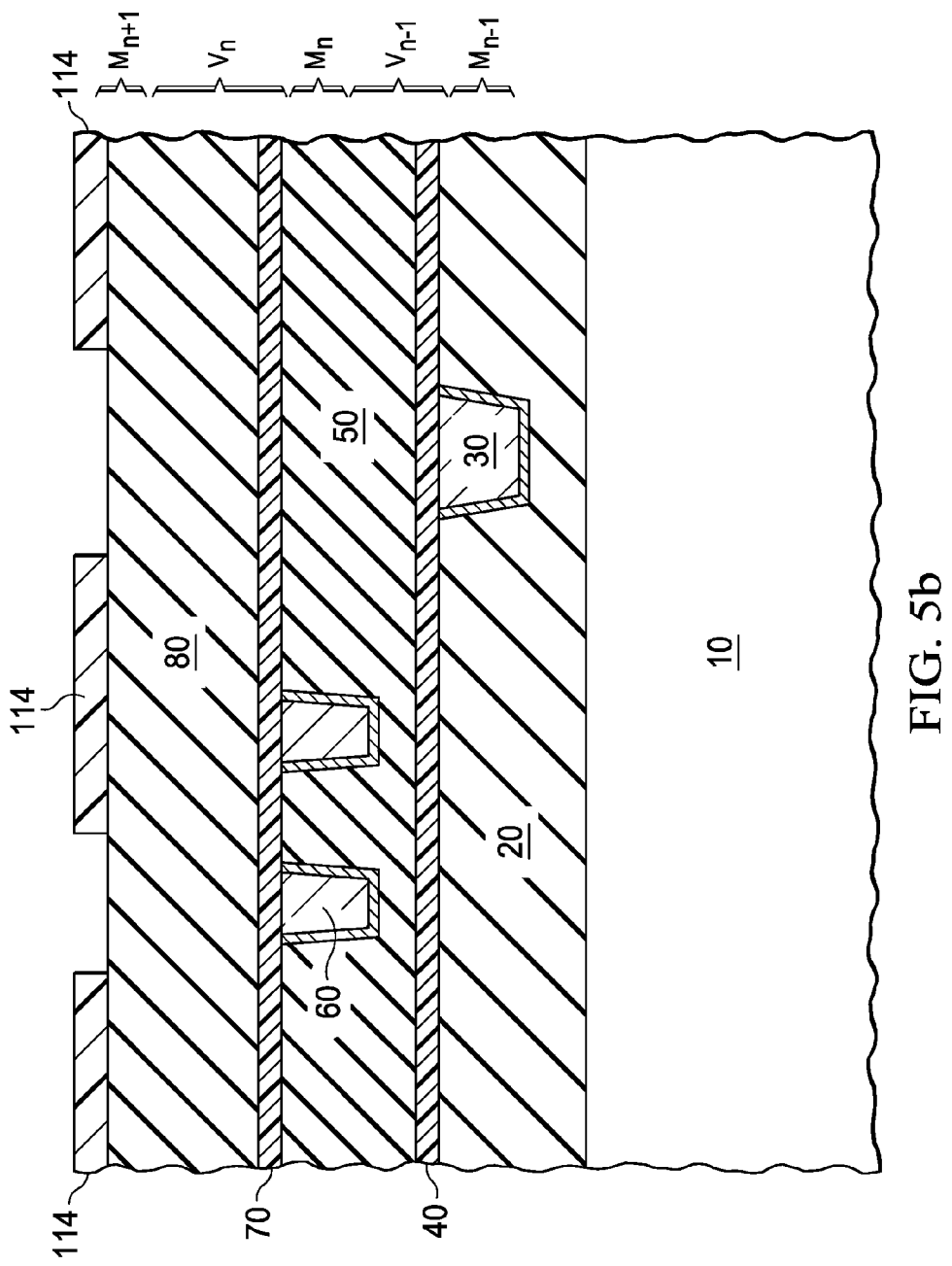

Referring next to FIG. 5b, metal lines are patterned formed onto the protective layer 114. As illustrated in FIG. 5b, using lithographic mask for the metal lines, the first photo resist 125 is exposed, developed, and patterned. Using the patterned first photo resist 125 as a mask, exposed protective layer 114 is etched to form metal line patterns.

Figure 5C:
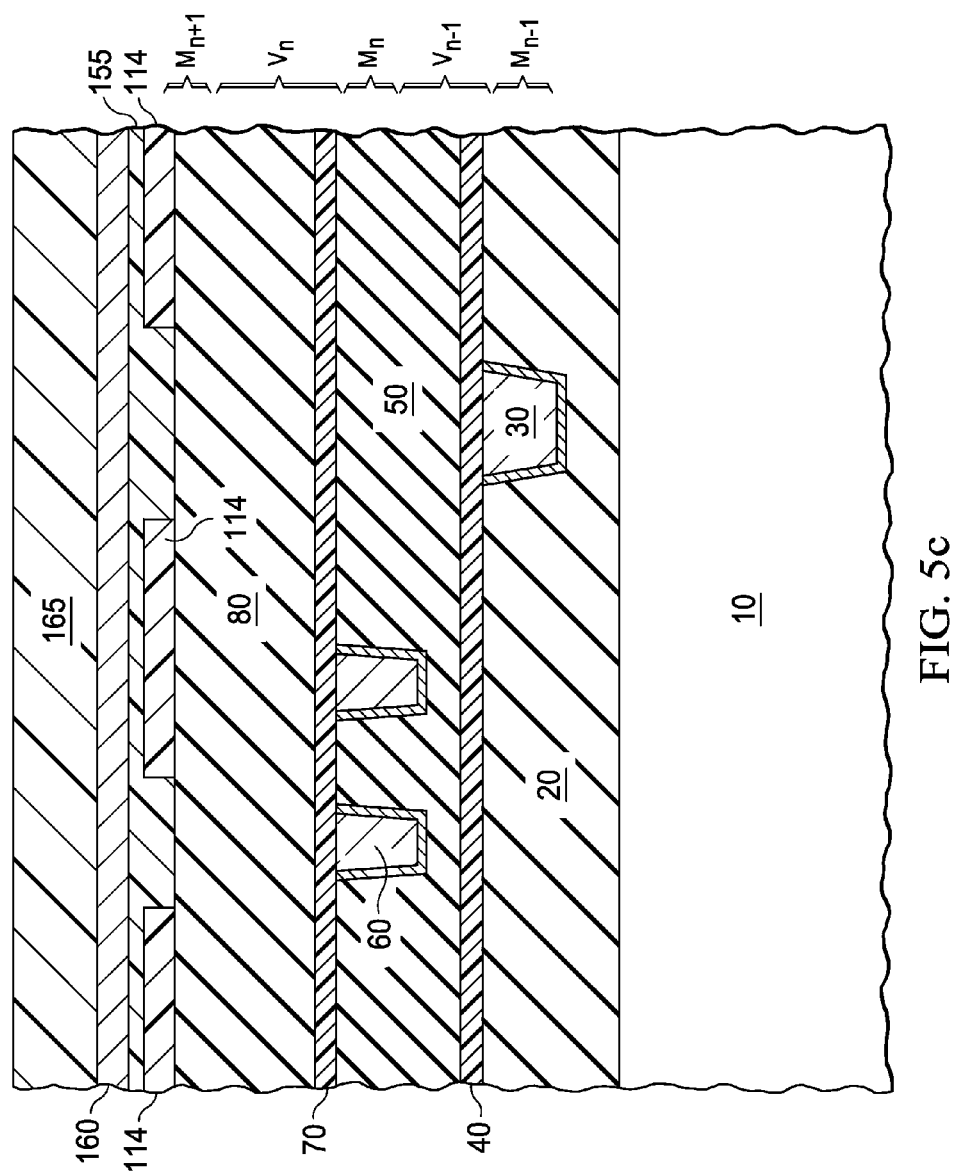

Referring next to FIG. 5c, a second hard mask layer 155 is deposited, followed by a deposition of a second patternable layer 160. A second photo resist 165 is deposited over the second patternable layer 160.

Figure 5D:
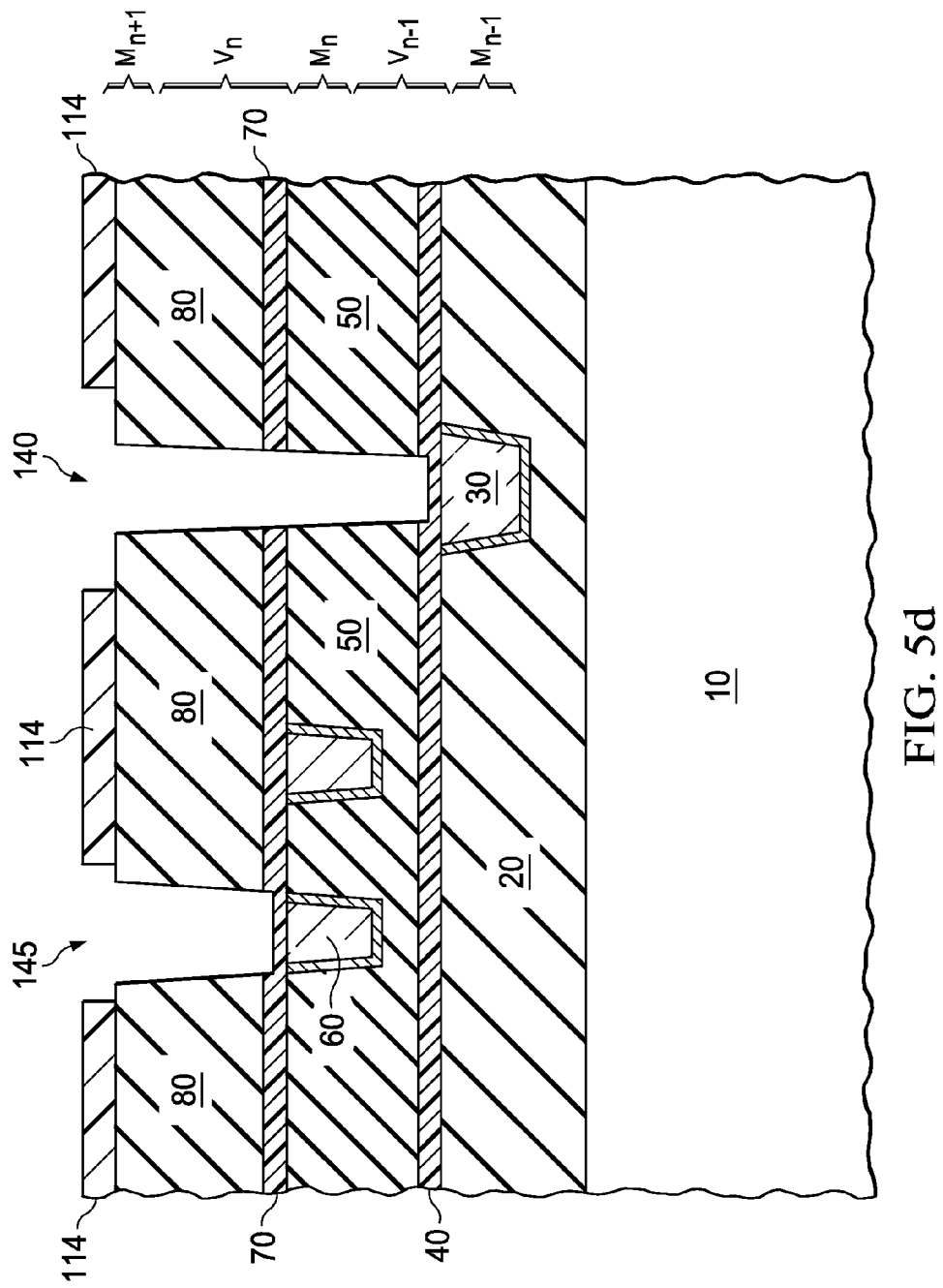

Referring next to FIG. 5d, a via mask is used to pattern the second photo resist 165 thereby forming an via opening 145 and a through via opening 140. The via etching process may be similar to that described in previous embodiments.

Figure 5E:
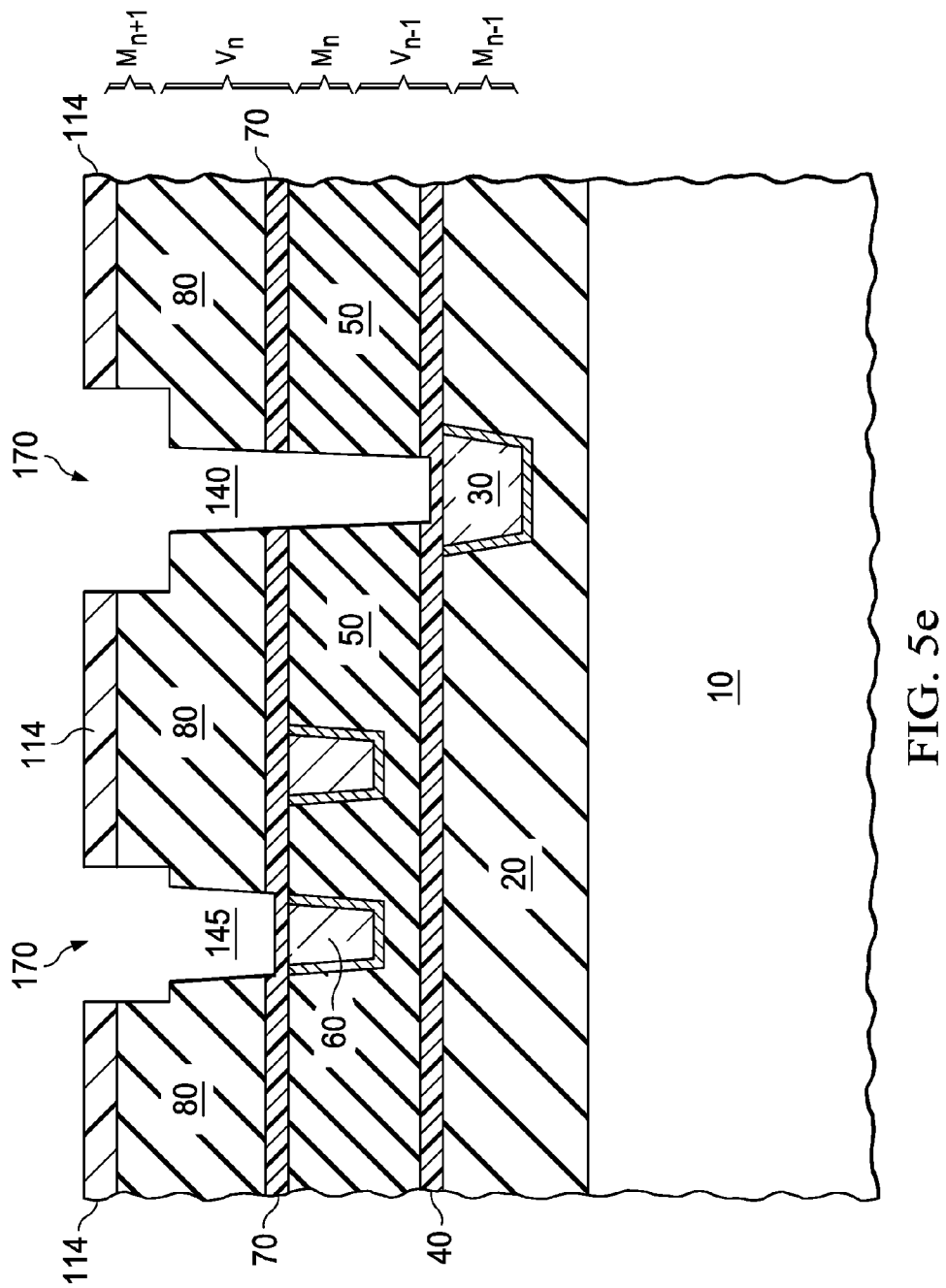

As illustrated next in FIG. 5e, using the patterned protective layer 114 (metal line patterns) as the mask, metal line trenches 170 are etched into the third inter-level dielectric layer 80.

Figure 5F:
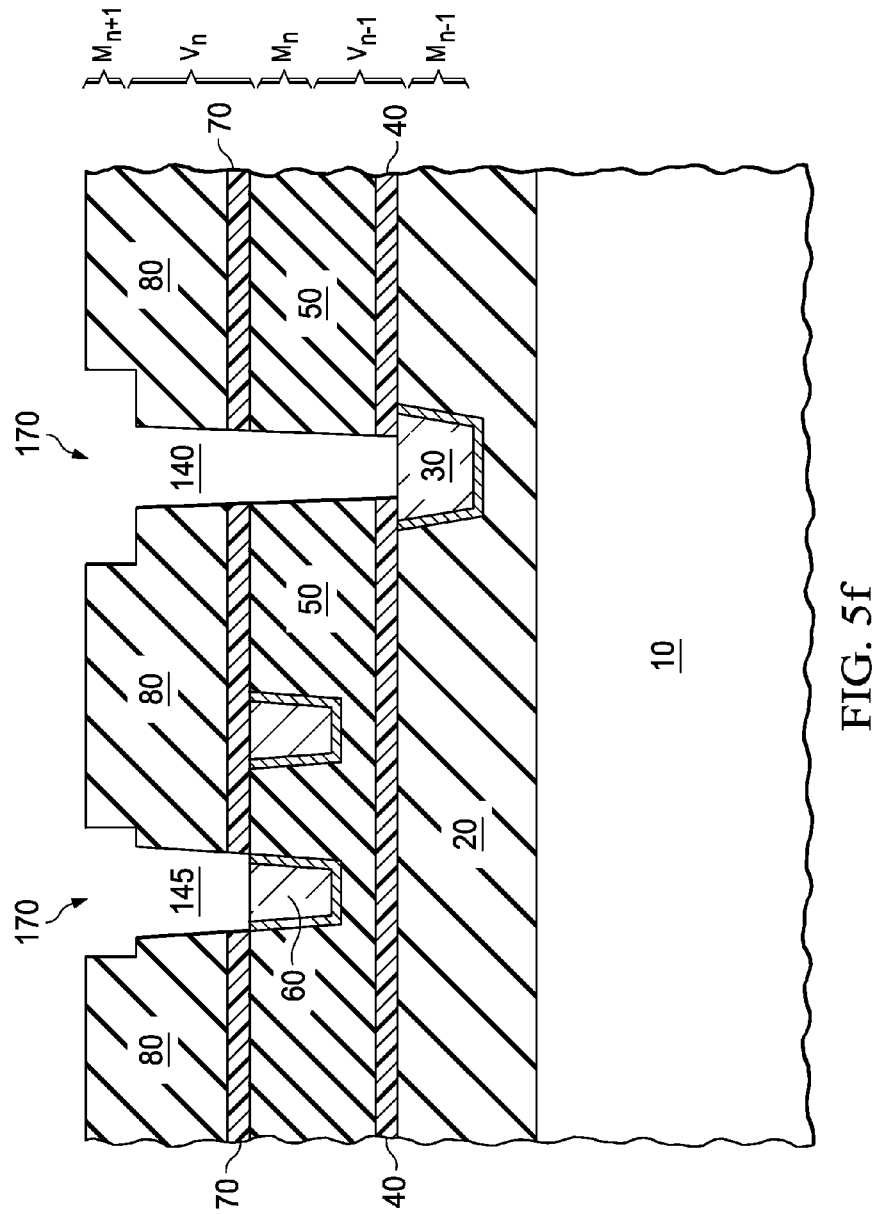

The protective layer 114 may be next etched (FIG. 5f). The etch stop liners are also removed exposing the underlying metal lines. For example, as the first and the second etch stop layers 40 and 70 comprise the same material, they may be etched simultaneously exposing the underlying metal.

Subsequent processing may follow as in the prior embodiment (FIG. 4f). For example, a conductive liner and conductive metal may be filled simultaneously into the through level via opening 140, the via opening 145, and the metal line trenches 170.

In various embodiments, the embodiment described in FIG. 5 may be used when the first, the second, and the third inter-level dielectric layers 20, 50, and 80 are about the same thickness.

Figure 6A:
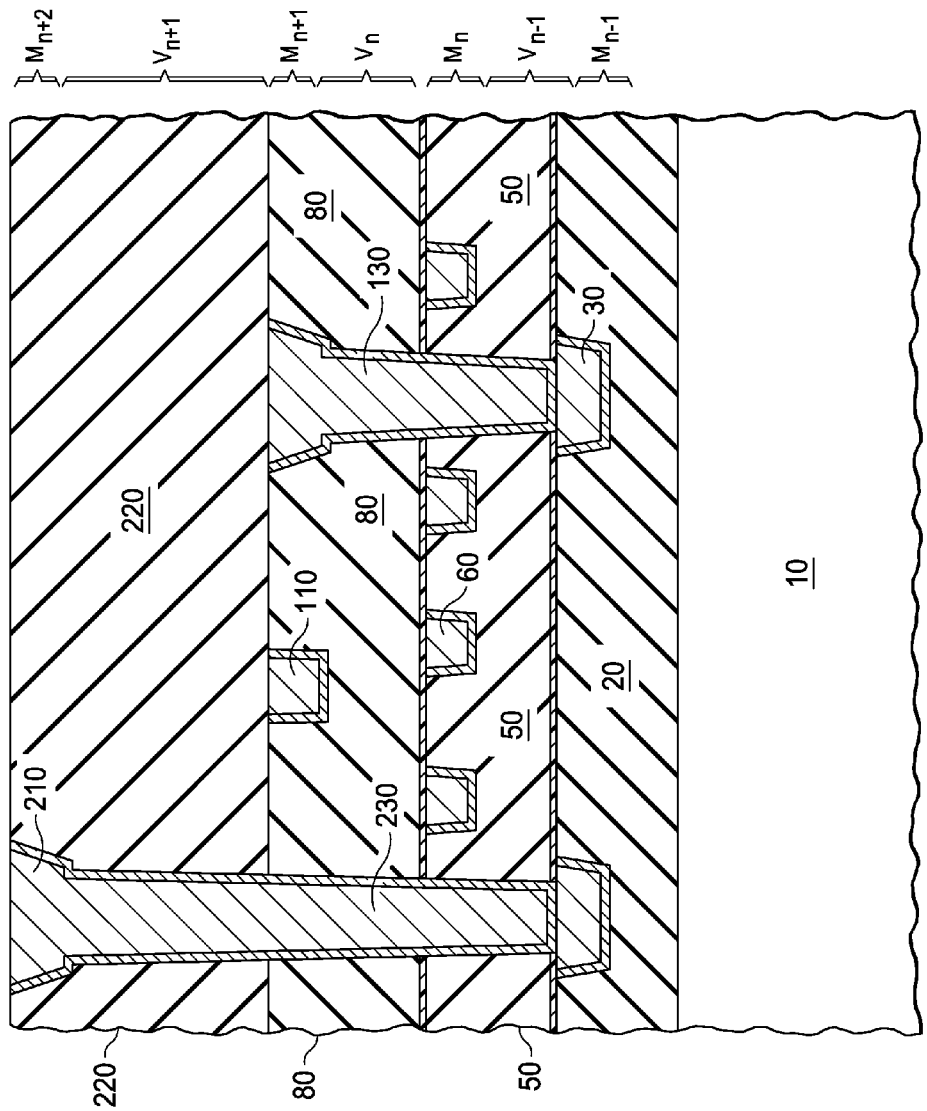
FIGS. 6a-6c, illustrates further structural embodiments of the invention.
Figure 6B:
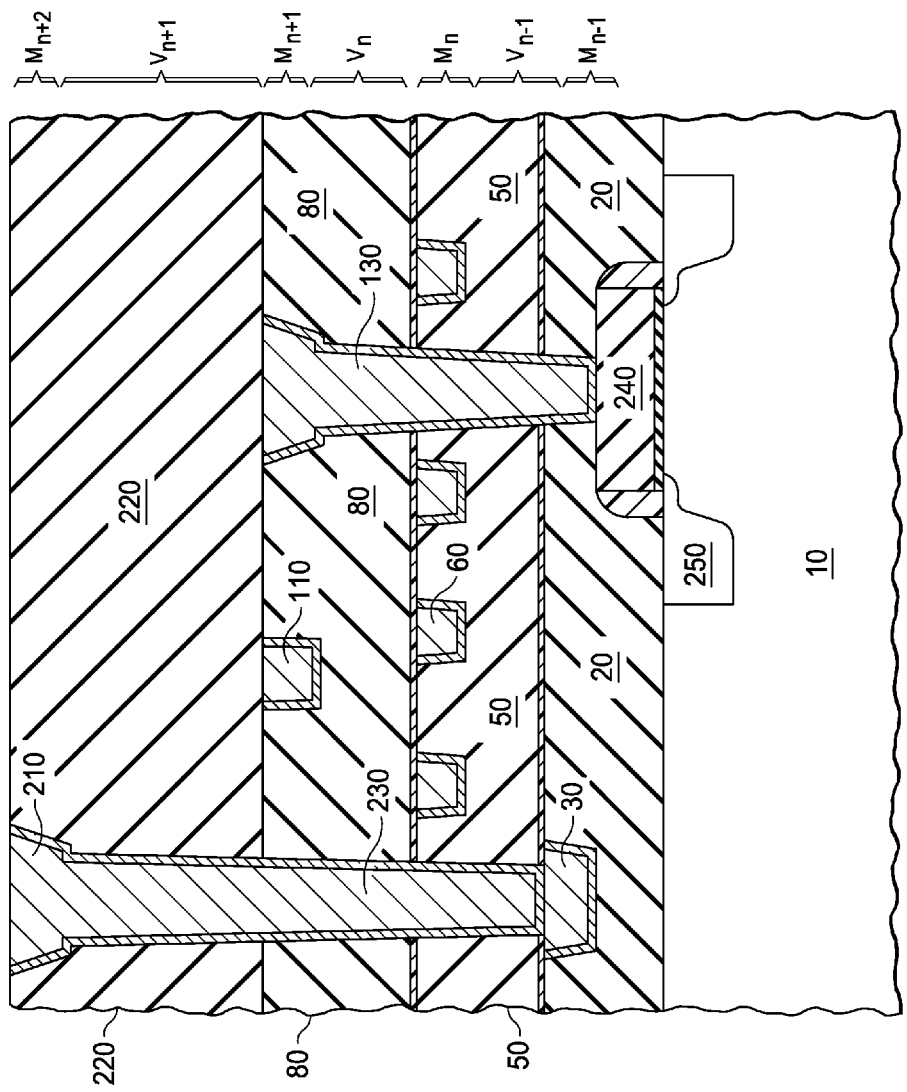
Figure 6C:
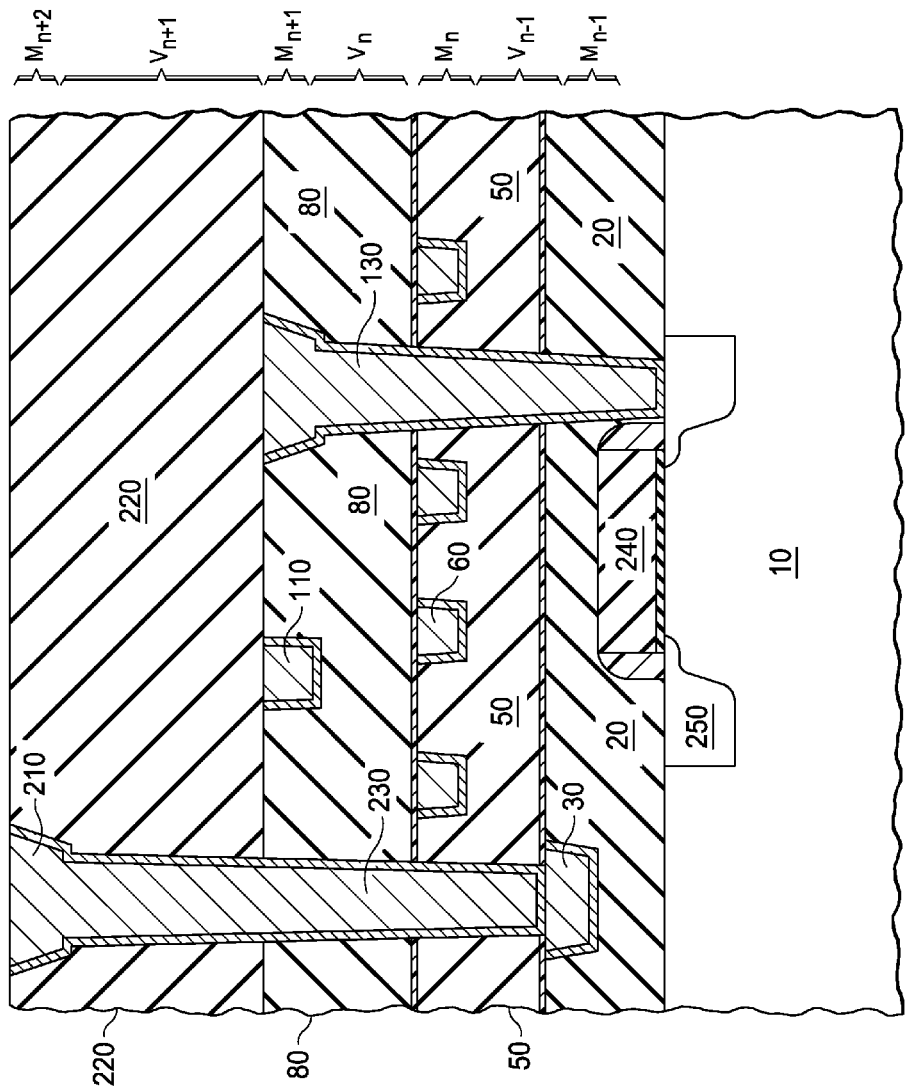

FIG. 6, which includes FIGS. 6a-6c, illustrates further structural embodiments of the invention.

Referring to FIG. 6a, the semiconductor device comprises the through level via 130 as in prior embodiments. As illustrated, fourth metal lines 210 are disposed in a fourth inter-level dielectric layer 220. An additional through level via 130 couples the fourth metal lines 210 from a higher metal level $M_{n+2}$ with first metal lines 30.

FIG. 6b illustrates a further embodiment comprising a transistor. The transistor comprises a gate region 240 and source/drain regions 250 as illustrated. In this embodiment, the through level via 130 directly couples the third metal lines 110 with the gate region 240.

FIG. 6c illustrates an alternative embodiment also comprising a transistor having a gate region 240 and source/drain regions 250. However, in this embodiment, the through level via 130 directly couples the third metal lines 110 with the source/drain regions 250.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first metal line disposed in a first metal level above a substrate;
   a second metal line disposed in a second metal level disposed over the first metal level, the second metal line separated from the first metal line by a first via level;
   a third metal line disposed in a third metal level disposed over the second metal level, the third metal line separated from the second metal line by a second via level, wherein the second via level is separated from the first via level by the second metal level, wherein the first metal level, the second metal level, the third metal level, the first via level, and the second via level are at different vertical levels from the substrate in a semiconductor device comprising three metal level and two via levels over the substrate; and a single continuous through level via contacting the first metal line and the third metal line, wherein the through level via has a first surface contacting the third metal line and a second surface contacting the third metal line, wherein the first surface is below the second metal line, wherein the second surface is above the second metal line, and wherein the first and the second surfaces are parallel to a major surface of the substrate, wherein the through level via extends completely through the first via level to the first metal line and further extends completely through the second via level to the third metal line, wherein the single continuous through level via comprises a first portion of a metal liner, wherein the third metal line comprises a second portion of the metal liner, wherein the first portion and the second portion are part of the same continuous metal liner, wherein the first portion of the metal liner surrounds sidewalls of the through level via in the first via level and the second via level and is disposed at the first surface contacting the first metal line, the second portion of the metal liner surrounds sidewalls of the third metal line.

2. The device of claim 1, wherein the first metal line is disposed in a first inter-level dielectric layer, wherein the second metal line is disposed in a second inter-level dielectric layer; and wherein the third metal line is disposed in a third inter-level dielectric.

3. The device of claim 1, wherein the third metal line and the through level via comprise copper.

4. The device of claim 3, wherein the second surface of the through level via and a bottom surface of the third metal line comprise copper.

5. The device of claim 1, further comprising:
a fourth metal line disposed in a fourth metal level disposed over the third metal level, the fourth metal line separated from the third metal line by a third via level; and
a second through level via contacting the first metal line and the fourth metal line, the second through level via extending through the first via level, the second via level, and the third via level.

6. The device of claim 1, further comprising:
a contact region on a surface of the substrate; and
a second through level via contacting the second metal line and the contact region.

7. The device of claim 1, further comprising:
a contact region on a surface of the substrate; and
a second through level via contacting the third metal line and the contact region.

8. A method of forming a semiconductor device, the method comprising:
forming a first metal level above a substrate, the first metal level comprising a first metal line;
forming a second metal level over the first metal level, the second metal level comprising a second metal line, the second metal line separated from the first metal line by a first via level;
forming a third metal level over the second metal level, the third metal level comprising a third metal line, the third metal line separated from the second metal line by a second via level; and
forming a single continuous through level via contacting the first metal line and the third metal line, wherein the through level via has a first surface contacting the first metal line and a second surface contacting the third metal line, wherein the first surface is below the second metal line, wherein the second surface is above the second metal line, and wherein the first and the second surfaces are parallel to a major surface of the substrate, wherein the through level via extends completely through the first via level to the first metal line and further extends completely through the second via level to the third metal line, wherein forming the single continuous through level via comprises forming a first portion of a metal liner, wherein forming the third metal level comprises forming a second portion of the metal liner, wherein the first portion and the second portion are formed in a single process step to form a continuous metal liner, wherein the first portion of the metal liner surrounds sidewalls of the through level via in the first via level and the second via level and is disposed at the first surface contacting the first metal line, the second portion of the metal liner surrounds sidewalls of the third metal line, wherein the second via level is separated from the first via level by the second metal level, and wherein the first metal level, the second metal level, the third metal level, the first via level, and the second via level are at different vertical levels from the substrate in a semiconductor device comprising three metal level and two via levels over the substrate.

9. The method of claim 8, wherein the through level via and the third metal line are filled using the same process.

10. The method of claim 9, wherein forming the through level via comprises:
forming a through via opening;
forming a metal line opening aligned over the through via opening; and
filling the through via opening and the metal line opening with a fill metal.

11. The method of claim 8, wherein forming the through level via comprises:
depositing a metal liner over a through via opening; and
depositing a fill metal over the metal liner.

12. A method of forming a semiconductor device, the method comprising:
forming a first inter-level dielectric layer comprising a first metal line over a substrate;
forming a second inter-level dielectric layer comprising a second metal line over the first inter-level dielectric layer, the second metal line separated from the first metal line by a first via level;
forming a third inter-level dielectric layer over the second inter-level dielectric layer;
forming a through via opening in the second and the third inter-level dielectric layers;
forming a pattern for a third metal line in the third inter-level dielectric layer, the third metal line separated from the second metal line by a second via level; and
filling the through via opening and the pattern for the third metal line with a conductive material to form a single continuous via extending from a first surface to an opposite second surface and the third metal line, wherein the first surface is above the second inter-level dielectric layer, wherein the second surface is below the second inter-level dielectric layer, and wherein the first and the second surfaces are parallel to a major surface of the substrate, wherein the single continuous via extends completely through the first via level to the first metal line and further extends completely through the second via level to the third metal line, wherein filling the through via opening and the pattern for the third metal line comprises forming a first portion and a second portion of a metal liner, wherein the first portion and the second portion are formed in a single process step to form a continuous metal liner, wherein the first portion of the metal liner surrounds sidewalls of the single continuous via in the first via level and the second via level and is disposed at the first surface contacting the first metal line, the second portion of the metal liner surrounds sidewalls of the third metal line.

13. The method of claim 12, wherein filling the through via opening comprises:
depositing a metal liner into the through via opening; and
using an electrochemical deposition process depositing a fill metal over the metal liner.

14. The method of claim 12, further comprising:
forming metal line trenches in the third inter-level dielectric layer after forming the through via opening; and
filling the metal line trenches after filling the through via opening.

15. The method of claim 12, further comprising:
filling the through via opening with a dummy fill material;
forming a metal line trench in the third inter-level dielectric layer, the metal line trench exposing a top surface of the dummy fill material in the through via opening;
removing the dummy fill material from the through via opening; and
filling the metal line trench with the conductive material after filling the through via opening with the conductive material.

16. The method of claim 15, wherein the dummy fill material comprises an anti-reflective coating material.

17. The method of claim 12, further comprising:
forming via openings in the third inter-level dielectric layer;
forming metal line trenches in the third inter-level dielectric layer after forming the through via opening and the via openings;
filling the via openings with the conductive material; and
filling the metal line trenches with the conductive material after filling the through via opening and the via openings.

18. The method of claim 12, further comprising:
forming via openings in the third inter-level dielectric layer;
filling the via openings and the through via opening with a dummy fill material;
forming metal line trenches in the third inter-level dielectric layer after filling the through via opening and the via openings;
removing the dummy fill material from the through via opening and the via openings;
filling the via openings with the conductive material; and
filling the metal line trenches with the conductive material after filling the through via opening and the via openings.

19. The method of claim 12, further comprising:
forming metal line trenches in the third inter-level dielectric layer before forming the through via opening; and
filling the metal line trenches.

20. The method of claim 12, further comprising:
before forming the through via opening, forming a protective layer over the third inter-level dielectric layer;
before forming the through via opening, patterning the protective layer for patterns for metal line trenches; and
after forming the through via opening, forming metal line trenches in the third inter-level dielectric layer using the patterns for metal line trenches.

21. A method of forming a semiconductor device, the method comprising:
forming a first inter-level dielectric layer comprising a first metal line over a substrate;
forming a second inter-level dielectric layer comprising a second metal line over the first inter-level dielectric layer, the second metal line being separated from the first metal line by a first via level;
forming a third inter-level dielectric layer over the second inter-level dielectric layer;
forming a protective layer over the third inter-level dielectric layer;
patterning the protective layer for patterns for metal line trenches;
after patterning the protective layer, forming a single continuous through via opening in the second and the third inter-level dielectric layers;
using the patterns for metal line trenches as a mask, forming a metal line trench over the through via opening; and
filling the through via opening and the metal line trench with a conductive material to form a single continuous feature comprising a first surface and an opposite second surface and a third metal line, wherein the third metal line is separated from the second metal line by a second via level, wherein the first surface is above the second inter-level dielectric layer and the second surface is below the second inter-level dielectric layer, and wherein the first and the second surfaces are parallel to a major surface of the substrate, wherein the single continuous feature completely through the first via level to the first metal line and further extends completely through the second via level to the third metal line, wherein filling the through via opening and the metal line trench comprises forming a first portion and a second portion of a metal liner, wherein the first portion and the second portion are formed in a single process step to form a continuous metal liner, wherein the first portion of the metal liner surrounds sidewalls of the single continuous feature in the first via level and the second via level and is disposed at the first surface contacting the first metal line, the second portion of the metal liner surrounds sidewalls of the third metal line.

22. The method of claim 21, wherein the protective layer comprises nitrogen doped silicon carbide.

23. The method of claim 21, wherein the protective layer comprises titanium nitride.

24. The method of claim 21, wherein the first, the second, and the third inter-level dielectric layers are about the same thickness.

25. The device of claim 1, wherein metal lines in the third metal level are disposed within an dielectric material.

26. The device of claim 1, wherein the second via level is disposed in the same dielectric material as the metal lines in the third metal level.

* * * * *